(12) United States Patent
Hirano et al.

(10) Patent No.: US 10,362,704 B2
(45) Date of Patent: Jul. 23, 2019

(54) INFORMATION PROCESSING APPARATUS

(71) Applicant: FUJITSU LIMITED, Kawasaki-shi, Kanagawa (JP)

(72) Inventors: Yukihiro Hirano, Fuchu (JP); Masanori Tachibana, Yokohama (JP); Akira Shimasaki, Kawasaki (JP); Yoshimi Maekawa, Kawasaki (JP); Misao Umematsu, Kawasaki (JP); Naomi Fukunaga, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/040,574

(22) Filed: Jul. 20, 2018

(65) Prior Publication Data
US 2019/0045652 A1 Feb. 7, 2019

(30) Foreign Application Priority Data
Aug. 4, 2017 (JP) ................. 2017-151543

(51) Int. Cl.
*H01R 25/00* (2006.01)
*H05K 7/14* (2006.01)
(Continued)

(52) U.S. Cl.
CPC ....... *H05K 7/1452* (2013.01); *H01R 13/6315* (2013.01); *H01R 13/743* (2013.01); *H01R 27/02* (2013.01); *H05K 7/1454* (2013.01); *H05K 7/1489* (2013.01); *H05K 7/1491* (2013.01); *H05K 7/1492* (2013.01); *H05K 7/20781* (2013.01)

(58) Field of Classification Search
CPC ............. H05K 7/1452; H05K 7/20781; H05K 7/1491; H05K 7/20772; H05K 7/20236; H05K 7/1485; H05K 7/20754; H05K 7/203; H05K 7/1492; H05K 7/1454; H01R 13/6315; H01R 13/743; F25B 27/02
USPC ......................................... 439/638
See application file for complete search history.

(56) References Cited

U.S. PATENT DOCUMENTS

| 4,988,308 A | 1/1991 | Toedtman |
| 8,184,436 B2* | 5/2012 | Campbell ............ H05K 7/203 361/700 |

(Continued)

FOREIGN PATENT DOCUMENTS

| JP | 4-332486 | 11/1992 |
| JP | 6-267622 | 9/1994 |

(Continued)

*Primary Examiner* — Jean F Duverne
(74) *Attorney, Agent, or Firm* — Fujitsu Patent Center

(57) ABSTRACT

An information processing apparatus includes a substrate that includes a first connector and a second connector, a backplane that includes a third connector coupled to the first connector and a fourth connector coupled to the second connector, and a metal plate attached to the backplane, wherein the metal plate has an opening to which the fourth connector is attached, wherein the first connector is arranged near a central part of the substrate on an end side inserted into the backplane and the second connector is arranged on each side of the first connector, and wherein a clearance between the opening of the metal plate and the fourth connector increases as a distance from the third connector to the fourth connector increases.

13 Claims, 25 Drawing Sheets

(51) Int. Cl.
*H01R 27/02* (2006.01)
*H05K 7/20* (2006.01)
*H01R 13/631* (2006.01)
*H01R 13/74* (2006.01)

(56) References Cited

U.S. PATENT DOCUMENTS

| | | | | |
|---|---|---|---|---|
| 8,522,569 | B2* | 9/2013 | Avery | F25B 27/02 |
| | | | | 62/238.6 |
| 9,155,230 | B2* | 10/2015 | Eriksen | H05K 7/20772 |
| 9,907,206 | B2* | 2/2018 | Branton | H05K 7/20754 |
| 10,064,313 | B2* | 8/2018 | Ishinabe | H05K 7/20236 |
| 10,178,807 | B2* | 1/2019 | Conn | H05K 7/1485 |
| 10,212,849 | B2* | 2/2019 | Matsumoto | H05K 7/20236 |
| 2009/0260777 | A1 | 10/2009 | Attlesey | |
| 2013/0128460 | A1 | 5/2013 | Rossi et al. | |

FOREIGN PATENT DOCUMENTS

| | | |
|---|---|---|
| JP | 2003-243095 | 8/2003 |
| JP | 2011-518395 | 6/2011 |
| JP | 2013-533635 | 8/2013 |

* cited by examiner

INFORMATION PROCESSING APPARATUS

CROSS-REFERENCE TO RELATED APPLICATION

This application is based upon and claims the benefit of priority of the prior Japanese Patent Application No. 2017-151543, filed on Aug. 4, 2017, the entire contents of which are incorporated herein by reference.

FIELD

The embodiments discussed herein are related to an information processing apparatus including a connector for a removable substrate.

BACKGROUND

High-performance information processing apparatuses and server devices that process and compute a considerable amount of information at high speed are desirably constructed such that many computation elements such as a plurality of central processing units (CPUs) and a plurality of graphics processing units (GPUs) (hereinafter referred to as CPUs) are connected together in parallel. The plurality of CPUs are mounted on a CPU board that is a circuit board unit having CPUs and memories mounted thereon and also having an input and output function and other control functions. In the CPU board, high-speed signal connection between the CPUs is achieved by circuit wiring (hereinafter referred to as a pattern). The information processing apparatus and the server device are hereinafter referred to as an information processing apparatus.

In general, the CPUs mounted in the information processing apparatus generate heat at high temperature. Therefore, a water-cooled information processing apparatus capable of cooling the CPUs more efficiently is becoming widespread. In the information processing apparatus, high-density mounting is desirable to mount a plurality of CPUs in a limited area. In this case, it is desirable that maintenance of the information processing apparatus may be carried out from the front of a rack that is a housing of the information processing apparatus so as to facilitate replacement of the CPU board having the CPUs mounted thereon. That is, the CPU board mounted in the information processing apparatus is removable from the information processing apparatus from the front of the rack.

FIG. 1 illustrates the structure of an information processing apparatus 10 of a comparative technology. A plurality of CPU board units 11 having a plurality of CPUs mounted thereon are mounted on a front side of a rack 12 in a height direction. The CPU board unit 11 includes a CPU board and a cover as a unit and is hereinafter referred to simply as a CPU board 11 while the illustration of the cover is omitted. The mounting of the plurality of CPU boards 11 on the front side of the rack 12 in the height direction may be referred to as mounting of the CPU boards 11 in a stacked state.

The CPU board 11 is inserted into the information processing apparatus 10 from the front of the rack 12 and is housed in the rack 12 while being guided by guide members 13 such as rails. The housed CPU board 11 is connected to a backplane 14 located in the rear of the rack 12 by a connector described later. The backplane 14 is hereinafter referred to as a BP 14. In the information processing apparatus 10 described in this comparative technology, two BPs 14 are arranged in the height direction of the information processing apparatus 10.

The BP 14 is fixed to the rack 12 with screws or the like. The plurality of CPU boards 11 are mounted in a stacked state in the rack 12 of the information processing apparatus 10. The CPU mounted on each of the plurality of CPU boards 11 is connected to the BP 14 by the connector and is connected to a CPU mounted on another CPU board 11 by a pattern formed on the BP 14. The CPU mounted on each of the plurality of CPU boards 11 is also connected to the other BP 14 of the same information processing apparatus 10 or to a BP 14 of another information processing apparatus 10 by a high-speed transmission cable (not illustrated) connected to the connector. The high-speed transmission cable is hereinafter referred to simply as a cable.

In general, the CPUs mounted on the CPU board 11 are cooled by cooling water. The cooling water is sent from an external cooling device (not illustrated) to a pipe 17 mounted in the rack 12 by using a hose. The cooling water that has entered the pipe 17 flows through one of two connection hoses 16 connected to the CPU board 11 and is supplied to the CPU board 11 via a water-cooling connector 18 (hereinafter referred to as a coupler 18). The coupler 18 is located on the CPU board 11 on the front side of the rack 12. The cooling water supplied to the CPU board 11 cools the CPUs through a cooling plate mounted on the CPU board 11. The cooling water turns into hot water and returns to the cooling device along an opposite route (through the coupler 18, the other connection hose 16, and the pipe 17). The cooling water is cooled and then reused.

FIG. 2 illustrates connection between the CPU board 11 and the BP 14 in the information processing apparatus 10. A plurality of CPUs 1 are mounted on the CPU board 11 and are connected together by a pattern 2 in the CPU board 11. A male or female high-speed transmission connector 3A (hereinafter referred to simply as a connector 3A) for connection to the BP 14 is mounted on the CPU board 11 on a rear side of the rack 12. A female or male connector 3 of an opposite type is mounted on the BP 14 side at a position that faces the connector 3A. Guide pins 4 and 4A (the guide pins 4 are located on the BP 14 side) are arranged on both sides of the connectors 3 and 3A, respectively, so as to securely fit the connectors 3 and 3A together. The connectors 3 and 3A are high-density connectors. Therefore, when the CPU board 11 is inserted into the information processing apparatus 10, the connector 3 on the BP 14 side is positionally fixed but the connector 3A on the CPU board 11 side and the connector 3 on the BP 14 side are securely fitted together through operations of the guide pins 4 and 4A. Thus, the CPU board 11 and the BP 14 are coupled together.

In a state in which the plurality of CPU boards 11 are coupled to the BP 14, each of the plurality of CPUs 1 mounted on each CPU board 11 and a CPU 1 mounted on another CPU board 11 are connected together by using a pattern in the BP 14. The CPU board 11 is connected to a CPU board 11 connected to the other BP 14 in the rack 12 or to a CPU board 11 mounted in a different information processing apparatus 10 by using cables 15 connected to cable connectors 8 attached to the BP 14 on the rear side of the rack 12. The connection between the cable connectors 8 attached to the BP 14 and the cables 15 is achieved by manually connecting each cable 15 to the corresponding cable connector 8.

The coupler 18 located at the distal end of the connection hose 16 through which the cooling water is exchanged between the pipe 17 and the CPU board 11 is manually connected to a coupler 18A mounted on the CPU board 11 on the front side of the rack 12. At the position where the CPUs 1 of the CPU board 11 are mounted, a cooling plate 9 is arranged so as to cool the CPUs 1. The inlet and the outlet of the cooling water in the cooling plate 9 are connected to the couplers 18A by conduits 19 arranged on the CPU board 11. The cooling water supplied from the pipe 17 to the CPU board 11 through one connection hose 16 and the couplers 18 and 18A cools the CPUs 1 by flowing through the cooling plate 9 from the conduit 19. The cooling water heated by flowing through the cooling plate 9 flows into the other couplers 18A and 18 through the conduit 19 and returns to the pipe 17 through the connection hose 16.

In recent years, the performance of the information processing apparatus has been increased so as to further increase the processing speed. It is desirable that the processing speed of a single CPU be increased and many CPUs be mounted and connected together.

The information processing apparatus of the comparative technology has the following problems.

(1) The fitting that uses the guide rails may be achieved by increasing the accuracy of the guide rails. When many high-density connectors are arranged on the back panel or when a plurality of high-density connectors are arranged on the substrate, the mere increase in the accuracy of the guide rails is not sufficient to achieve the fitting.

(2) The high-density mounting is desirable to mount more CPUs. Due to the manual connection of cables and couplers, it is desirable to secure a manual access or unlocking space to be used when the CPU board is inserted into and removed from the information processing apparatus, thereby hindering the high-density mounting.

The problems are described in more detail with reference to FIG. 3. As illustrated in FIG. 3, the connection hose 16 is manually connected to the coupler 18A located on the CPU board 11 on the front side of the rack 12. This structure causes a problem in that an access space indicated by the broken line is desired for insertion and removal of the connection hose 16 into and from the coupler 18A during maintenance work.

The cable 15 for connection to other information processing apparatuses is connected to the BP 14 on the rear side of the rack 12 by the cable connector 8. Therefore, the information processing apparatus 10 has a problem in that an access space indicated by the broken line is desired for insertion and removal of the cable 15 into and from the cable connector 8 during maintenance work.

The followings are reference documents.
[Document 1] Japanese National Publication of International Patent Application No. 2011-518395,
[Document 2] Japanese National Publication of International Patent Application No. 2013-533635,
[Document 3] Japanese Laid-open Patent Publication No. 2003-243095,
[Document 4] Japanese Laid-open Patent Publication No. 6-267622, and
[Document 5] Japanese Laid-open Patent Publication No. 4-332486.

SUMMARY

According to an aspect of the invention, an information processing apparatus includes a substrate that includes a first connector and a second connector, a backplane that includes a third connector coupled to the first connector and a fourth connector coupled to the second connector, and a metal plate attached to the backplane, wherein the metal plate has an opening to which the fourth connector is attached, wherein the first connector is arranged near a central part of the substrate on an end side inserted into the backplane and the second connector is arranged on each side of the first connector, and wherein a clearance between the opening of the metal plate and the fourth connector increases as a distance from the third connector to the fourth connector increases.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 22A to FIG. 22D are views for describing a cable connector that is newly arranged in the structure for mounting the removable substrate according to the fifth embodiment, in which FIG. 22A is a partial view of a metal plate, illustrating a modified example of the opening formed in the metal plate, FIG. 22B is a perspective view of the cable connector attached to the opening illustrated in FIG. 22A, FIG. 22C is a vertical sectional view of the metal plate in a state in which the cable connector illustrated in FIG. 22B is attached to the metal plate, and FIG. 22D is a partial view of the metal plate, illustrating a deformed state of the cable connector illustrated in FIG. 22B when the cable connector is attached to the opening illustrated in FIG. 22A;

DESCRIPTION OF EMBODIMENTS

Embodiments disclosed herein are described below in detail with reference to the accompanying drawings. In the embodiments described below, the same or like elements are denoted by common reference symbols. To facilitate understanding, the scales of the drawings are changed as appropriate. In the description, the same components as those of the comparative technology are denoted by the same reference symbols.

Figure 1:
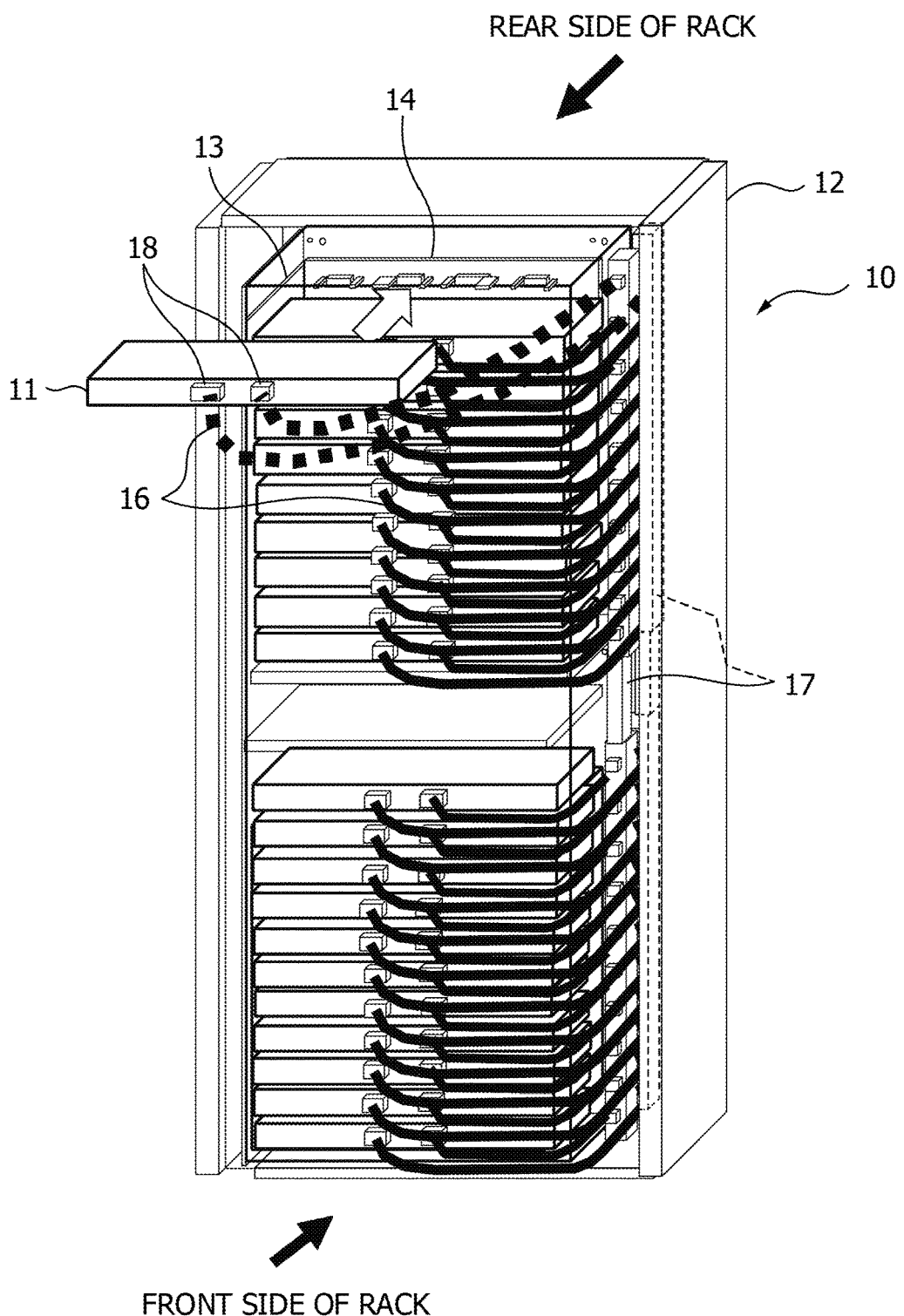
FIG. 1 is a perspective view illustrating the overall structure of an information processing apparatus of a comparative technology.
Figure 2:
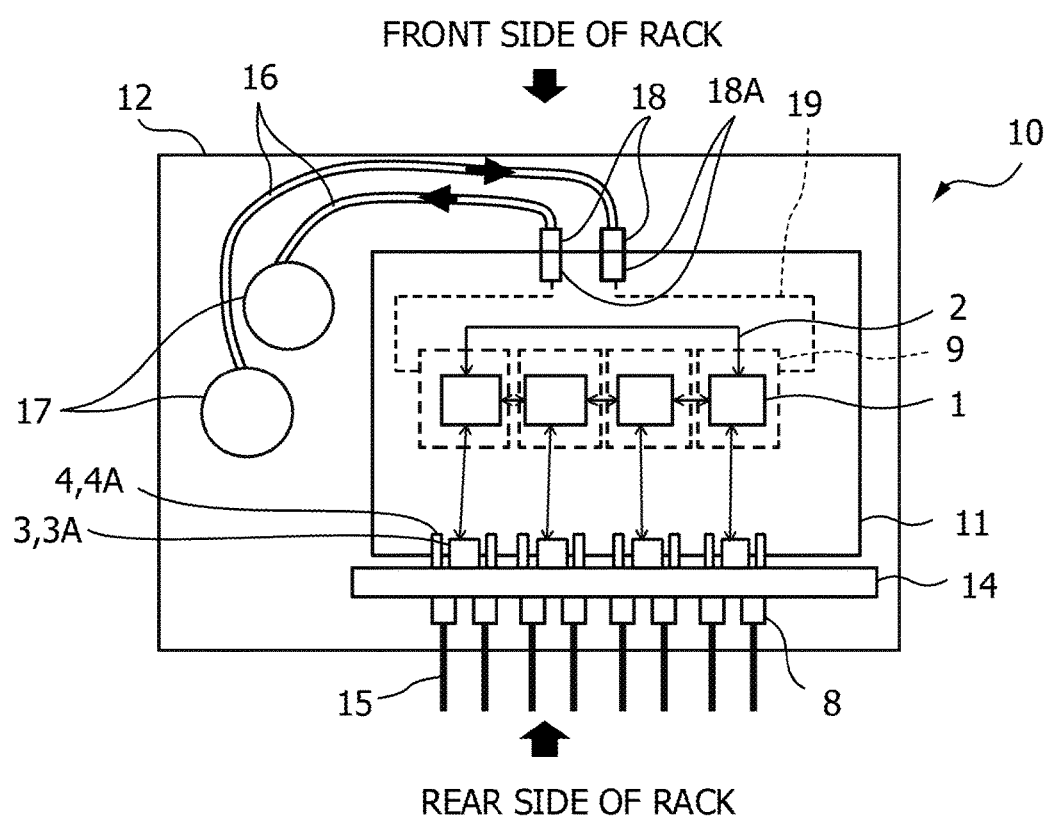
FIG. 2 is a horizontal sectional view of the information processing apparatus illustrated in FIG. 1.
Figure 3:
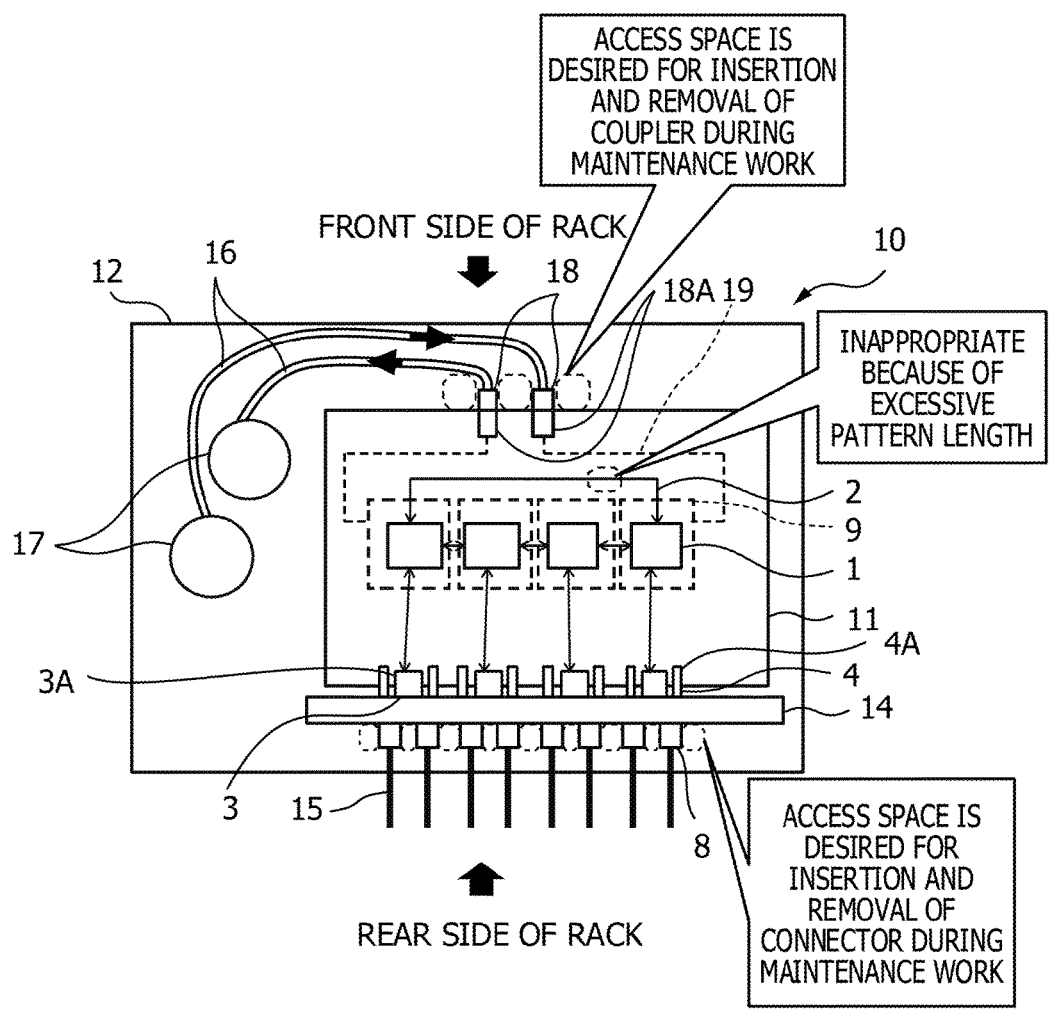
FIG. 3 is an explanatory view for describing problems by using the horizontal sectional view of the information processing apparatus illustrated in FIG. 2.
Figure 4:
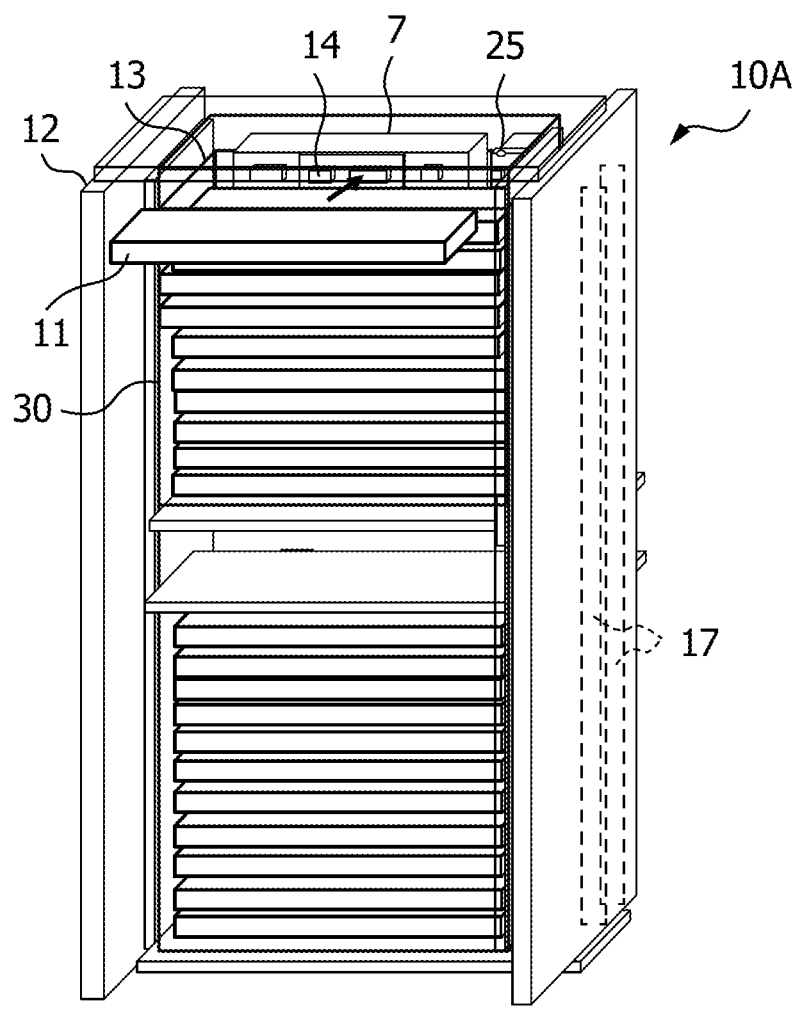
FIG. 4 is a perspective view illustrating the overall structure of a disclosed information processing apparatus of a first mode.
Figure 5:
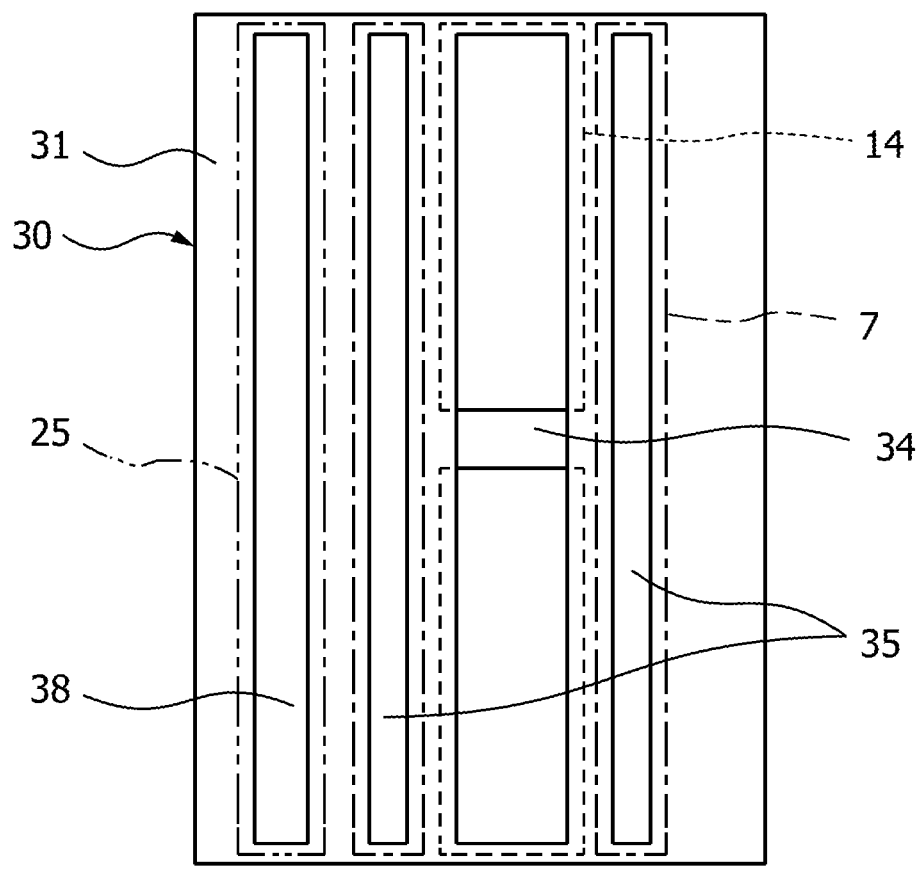
FIG. 5 is a rear view of an example of a module box built in the information processing apparatus illustrated in FIG. 4.
Figure 6:
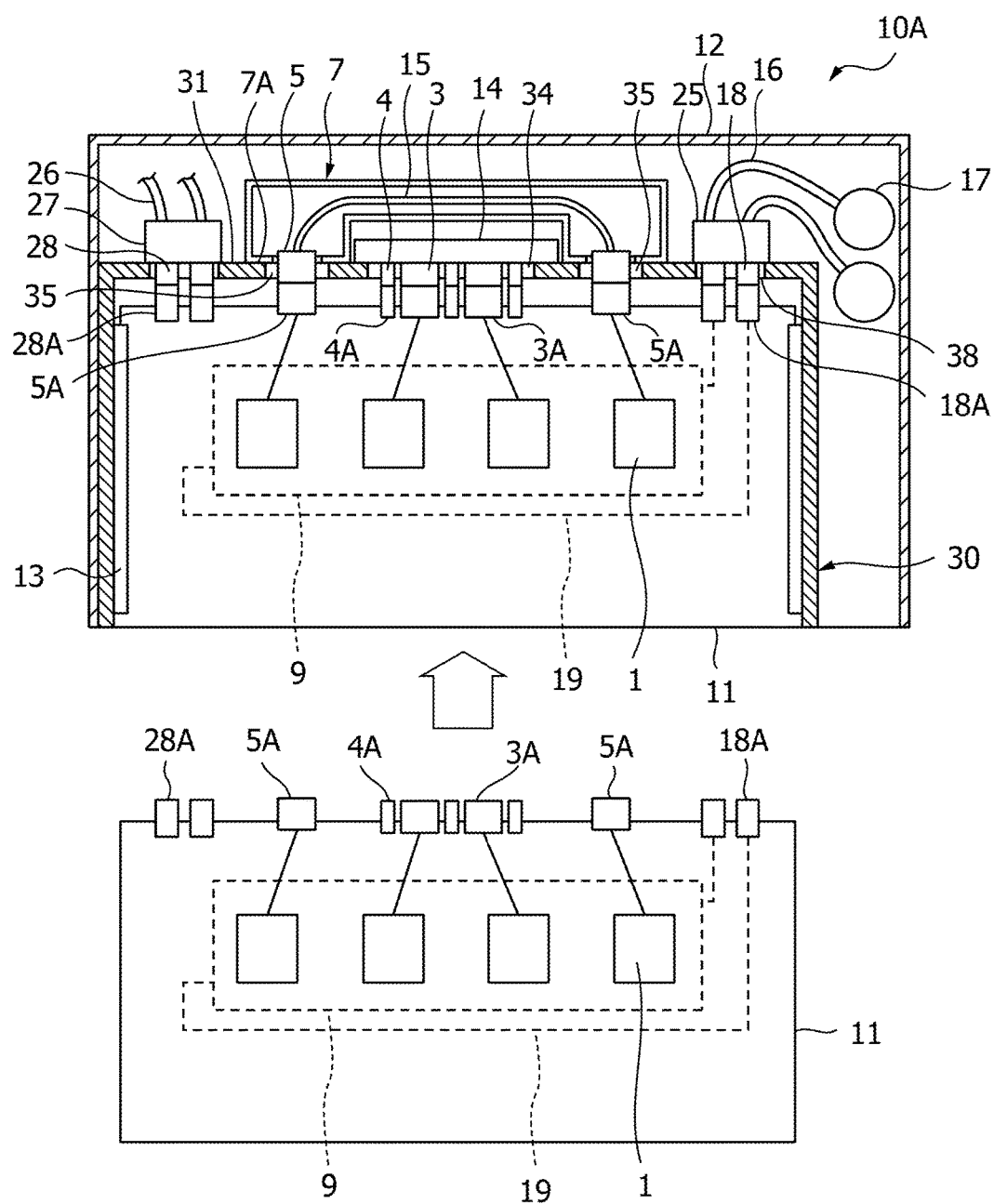
FIG. 6 is a horizontal sectional view of the information processing apparatus of the first mode in a state before and after a removable substrate is inserted into the information processing apparatus, illustrating a disclosed structure for mounting the substrate according to a first embodiment.
Figure 7:
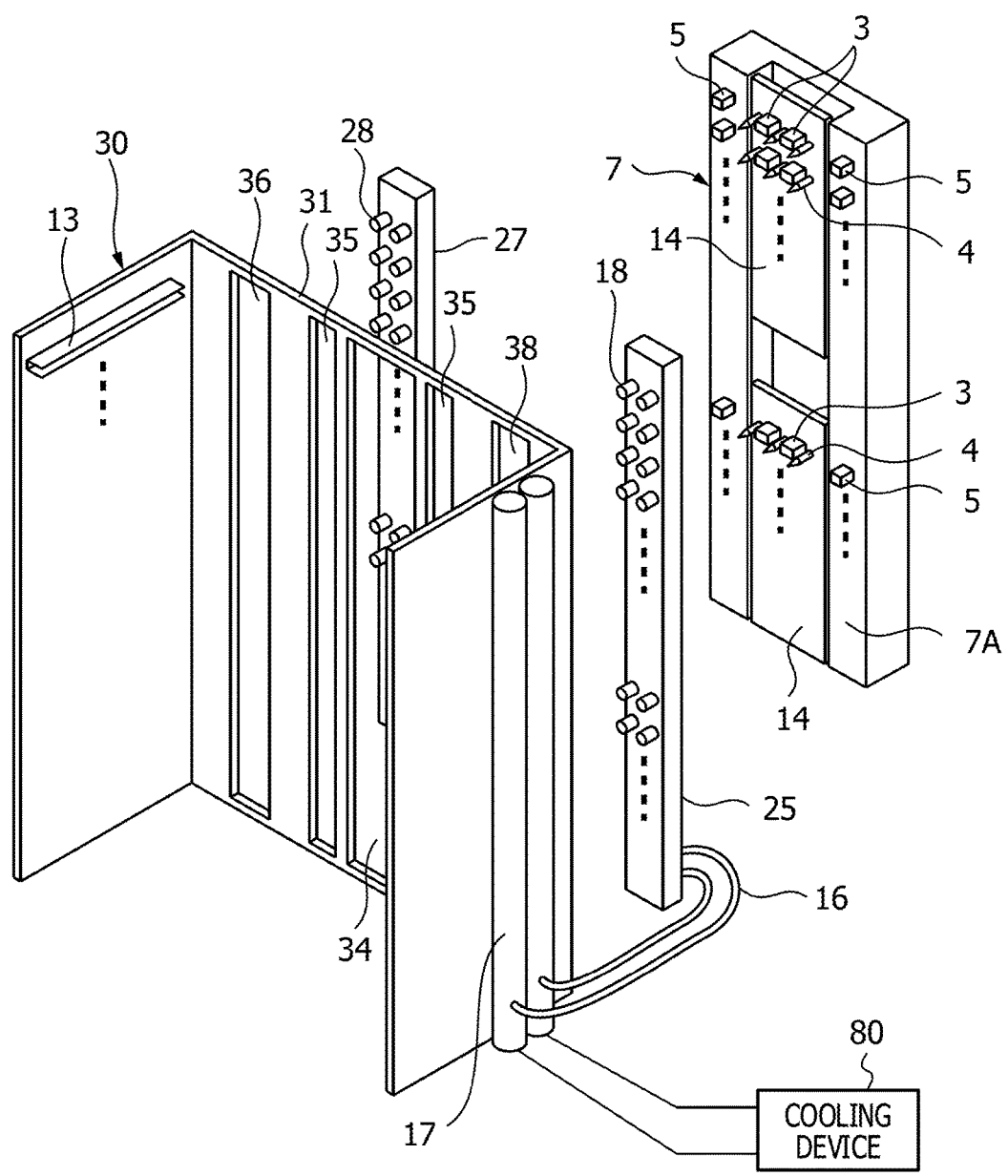
FIG. 7 is a perspective assembly view illustrating a state in which a first cable unit, BPs, a branch pipe, and a power unit are attached to the module box of the information processing apparatus illustrated in FIG. 6.

FIG. 4 is a perspective view illustrating the overall structure of a disclosed information processing apparatus 10A of a first mode. FIG. 5 is a rear view of a module box 30 built in the information processing apparatus 10A. Illustration of a power unit 27 is omitted from FIG. 4 and FIG. 5. FIG. 6 is a horizontal sectional view of the information processing apparatus 10A in a state before and after a CPU board 11 is inserted into the information processing apparatus 10A illustrated in FIG. 5. FIG. 7 is a perspective assembly view illustrating the structures of a first cable unit 7, BPs 14, the module box 30, a branch pipe 25, and the power unit 27 that are arranged in the information processing apparatus 10A. The structure of the information processing apparatus 10A is described with reference to FIG. 4 to FIG. 7.

As illustrated in FIG. 4, the module box 30 open to a front side of the information processing apparatus 10A is arranged in a rack 12 of the information processing apparatus 10A. On the inner walls of the module box 30 that face each other, guide members 13 such as rails extending in a depth direction are arranged at a plurality of stages. A plurality of CPU boards 11 are inserted into the information processing apparatus 10A from the front side of the information processing apparatus 10A and are mounted in a stacked state in the module box 30 while being guided by the guide members 13. As illustrated in FIG. 5, in a rear plate 31 of the module box 30, a backplane hole 34 (hereinafter referred to as a BP hole 34), two first cable unit holes 35, and a cooling water hole 38 are formed in parallel in a vertical direction. When the power unit 27 is arranged in the information processing apparatus 10A, a power unit hole 36 is added in the rear plate 31 of the module box 30 as illustrated in FIG. 7. FIG. 6 and FIG. 7 illustrate a case in which the power unit 27 is arranged.

As illustrated in FIG. 7, connectors 3 and guide pins 4 are arranged on attachment surfaces for the rear plate 31 in the two BPs 14 arranged in a height direction of the information processing apparatus 10A. Housing-side cable connectors 5 (hereinafter referred to simply as cable connectors 5) are arranged on attachment surfaces 7A for the rear plate 31 in the first cable unit 7. Couplers 18 are arranged on an attachment surface for the rear plate 31 in the branch pipe 25. Power connectors 28 are arranged on an attachment surface for the rear plate 31 in the power unit 27. The two BPs 14 are attached to the rear plate 31 of the module box 30 with screws or the like in a state in which the connectors 3 and the guide pins 4 are inserted through the BP hole 34.

The first cable unit 7 has a C-shape in plan view. Two attachment surfaces 7A for the rear plate 31 are arranged on both sides across the BP 14. The first cable unit 7 is attached to the rear plate 31 of the module box 30 with screws or the like in a state in which the cable connectors 5 on the attachment surfaces 7A are inserted through the two first cable unit holes 35. The branch pipe 25 is attached to the rear plate 31 of the module box 30 with screws or the like in a state in which the couplers 18 are inserted through the cooling water hole 38. The power unit 27 is attached to the rear plate 31 of the module box 30 with screws or the like in a state in which the power connectors 28 are inserted through the power unit hole 36.

The connectors 3 and the guide pins 4 arranged on the attachment surfaces for the rear plate 31 in the BPs 14 may be identical to the connectors 3 and the guide pins 4 arranged on the BPs 14 described in the comparative technology. Examples of the structures of the cable connectors 5 arranged on the attachment surfaces 7A for the rear plate 31 in the first cable unit 7, the couplers 18 arranged on the attachment surface for the rear plate 31 in the branch pipe 25, and the power connectors 28 of the power unit 27 are described later in detail. The BP hole 34 formed in the rear plate 31 may have any size and shape as long as the connectors 3 and the guide pins 4 are insertable therethrough. The BP hole 34 may have a shape other than the rectangular shape unlike this embodiment. The two first cable unit holes 35, the cooling water hole 38, and the power unit hole 36 may have any size and shape as long as the cable connectors 5, the couplers 18, and the power connectors 28 are freely movable in the holes. The two first cable unit holes 35, the cooling water hole 38, and the power unit hole 36 may have a shape other than the rectangular shape unlike this embodiment.

As illustrated in FIG. 6, two pipes 17 where cooling water flows from a cooling device 80 (see FIG. 7) are arranged in a space between the rack 12 and the module box 30 and are connected to the branch pipe 25 by connection hoses 16, respectively. A plurality of CPUs 1 are mounted on the CPU board 11. At the position where the CPUs 1 are mounted, a cooling plate 9 is arranged so as to cool the CPUs 1. The inlet and the outlet of the cooling water in the cooling plate 9 are connected to couplers 18A by conduits 19. The cooling water flowing through the branch pipe 25 is split to circulate through the cooling plate 9.

As illustrated in FIG. 7, the branch pipe 25 is arranged in a height direction of the rear plate 31. The couplers 18 are arranged at positions corresponding to the CPU boards 11 mounted in the module box 30 and are attached to the rear plate 31. As illustrated in FIG. 7, the power unit 27 is arranged in the height direction of the rear plate 31 and is connected to a power source (not illustrated) located outside the information processing apparatus 10A to supply electric power to the power connectors 28. The power connectors 28 are arranged on the power unit 27 at positions corresponding to the CPU boards 11 mounted in the module box 30 and are attached to the rear plate 31.

As illustrated in FIG. 6, connectors 3A serving as first connectors, guide pins 4A, substrate-side cable connectors 5A serving as second connectors, the couplers 18A, and power connectors 28A are arranged on the edge of the CPU board 11 on the BP 14 side. The substrate-side cable connectors 5A are hereinafter referred to simply as cable connectors 5A. The connectors 3A are high-density connectors and are fitted to the connectors 3 serving as third connectors on the BP 14.

The guide pins 4A are arranged on both sides of each connector 3A and assist the fitting of the connectors 3 and 3A. That is, as described in the comparative technology, the guide pins 4A of the CPU board 11 are fitted to the guide pins 4 arranged on the BP 14 for use in positioning so that the connectors 3A arranged on the CPU board 11 are fitted to the connectors 3 arranged on the BP 14.

The cable connectors 5A are arranged on both sides of the guide pins 4A and are fitted to the cable connectors 5 serving as fourth connectors protruding from the first cable unit 7 attached to the rear plate 31 of the module box 30. The couplers 18A are arranged on one end side of the CPU board 11 and are fitted to the couplers 18 of the branch pipe 25 attached to the rear plate 31 of the module box 30. The power connectors 28A are fitted to the power connectors 28 arranged on the power unit 27.

As illustrated in FIG. 7, the two BPs 14 are fixed to the rear plate 31 on a rear side of the rack 12 in the vertical direction. The connectors 3 and the guide pins 4 similar to the connectors 3 and the guide pins 4 attached to the BP 14 described in the comparative technology are arranged on each BP 14. When the BPs 14 are attached to the rear side of the rear plate 31, the connectors 3 and the guide pins 4 arranged on the BPs 14 are inserted through the BP hole 34 formed in the rear plate 31 and protrude to an inner side of the rear plate 31. When the CPU board 11 is inserted into the module box 30, the guide pins 4A arranged on the CPU board 11 are first connected to the guide pins 4 arranged on the BP 14 and the connectors 3A of the CPU board 11 are fitted to the connectors 3 arranged on the BP 14.

Simultaneously, the cable connectors 5A, the couplers 18A, and the power connectors 28A on the CPU board 11 side are fitted to the cable connectors 5 of the first cable unit 7, the couplers 18 of the branch pipe 25, and the power connectors 28 of the power unit 27, respectively. At this time, the cable connectors 5 of the first cable unit 7, the couplers 18 of the branch pipe 25, and the power connectors 28 of the power unit 27 are located away from the guide pins 4 arranged on the BP 14. Thus, the positions of the cable connectors 5A, the couplers 18A, and the power connectors 28A mounted on the CPU board 11 in correspondence with those components may deviate due to attachment tolerances. Therefore, as described later, the cable connectors 5 of the first cable unit 7, the couplers 18 of the branch pipe 25, and the power connectors 28 of the power unit 27 may absorb the deviations of the positions of the cable connectors 5A, the couplers 18A, and the power connectors 28A.

In the disclosed information processing apparatus 10A, the CPUs 1 on the CPU board 11 that are connectable within a pattern length limit of the BP 14 are connected together by using the pattern on the BP 14 while connecting the CPU board 11 to the BP 14 by the cable connectors 5 and 5A. The CPUs 1 on the CPU board 11 that are not connectable within the pattern length limit of the BP 14 are connected together by using cables 15 without using the pattern on the BP 14. Since the plurality of CPU boards 11 are arranged, the cables 15 are housed in the first cable unit 7 as a unit and are connected to the cable connectors 5 arranged at the respective stages of the CPU boards 11.

The cable connectors 5A mounted on the CPU board 11 are located away from the guide pins 4A (for example, 100 mm away from the guide pins 4A) and therefore positionally deviate due to an attachment tolerance. If the deviation is, for example, ±0.3 mm from the conditions described above, the deviation of the cable connector 5A is ±0.6 mm that is twice as large as ±0.3 mm because the first cable unit 7 has the two attachment surfaces 7A. In this case, it is desirable to absorb a deviation of, for example, ±1.0 mm so as to permit a deviation equal to or larger than the deviation of the cable connector 5A. In the disclosed mounting structure, the deviation of ±1.0 mm is absorbed by imparting a floating function to the cable connector 5 of the first cable unit 7.

That is, the cable connectors 5 located on both ends of the cable 15 housed in the first cable unit 7 have a floatable structure along two axes (vertical and lateral directions) on the attachment surfaces 7A for the rear plate 31 of the module box 30 in the first cable unit 7. The floatable structure is a structure in which the cable connector 5 is fitted to an attachment hole (opening) formed in the attachment surface 7A for the rear plate 31 of the module box 30 in the first cable unit 7 with a predetermined clearance. In the floatable structure, the cable connector 5 is movable in the vertical and lateral directions (two-axis directions).

As illustrated in FIG. 7, the first cable unit 7 attached to the rear side of the rear plate 31 is an integrated cable holding unit having a C-shape in plan view and is shaped to extend over the two BPs 14 arrayed in the vertical direction. As illustrated in FIG. 7, the cable connectors 5 are attached to the two attachment surfaces 7A for the rear plate 31 in the first cable unit 7 while being arrayed in the vertical direction. The number of cable connectors 5 on one attachment surface 7A is equal to the number of CPU boards 11 mounted in the module box 30. Two cable connectors 5 at the same stage are connected together by the cable 15 in the first cable unit 7.

A structure for mounting the cable connector 5 to be attached to the attachment surface 7A for the rear plate 31 of the module box 30 in the first cable unit 7 according to a first embodiment is described with reference to FIG. 8A to FIG. 8D. The attachment surface 7A for the rear plate 31 in the first cable unit 7 corresponds to a metal plate to which the cable connector 5 is attached.

Figure 8A:
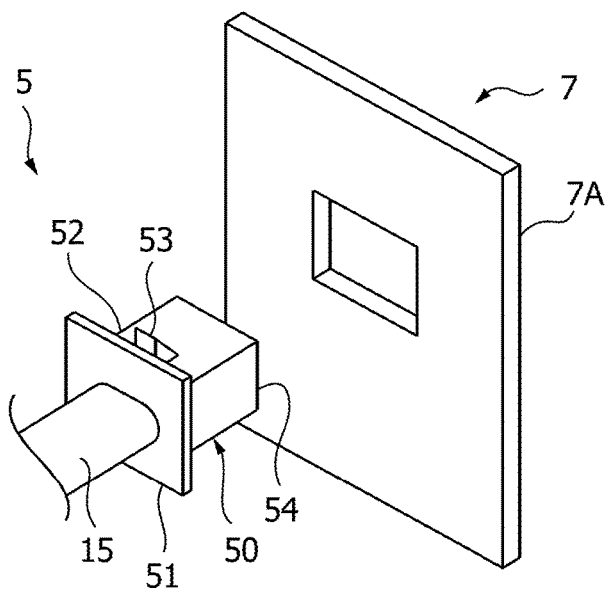
FIG. 8A is a perspective assembly view illustrating a state in which a disclosed cable connector is to be attached to a metal plate that is attached to the information processing apparatus.
Figure 8B:
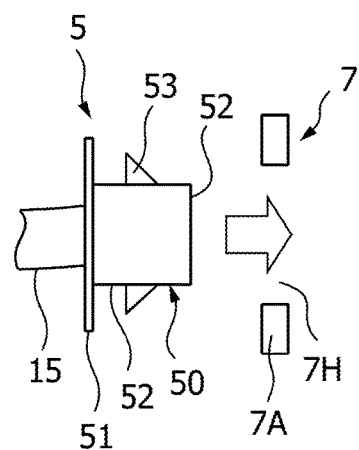
FIG. 8B is a horizontal sectional view for the perspective assembly view illustrated in FIG. 8A.

As illustrated in FIG. 8A and FIG. 8B, the cable 15 is connected to a body 50 of the cable connector 5. A first engagement portion 51 is formed on the body 50 on a side where the cable 15 is connected. In this embodiment, the first engagement portion 51 has a flange shape but may have a shape other than the flange shape. A part of the body 50 of the cable connector 5 that extends from the first engagement portion 51 is a pass-through portion 52 to be located in an opening 7H described later. Second engagement portions 53 protrude from upper and lower surfaces of a part that extends from the pass-through portion 52.

The second engagement portion 53 has an inclined surface on a distal end surface 54 side of the body 50 and a perpendicular surface formed upright on the first engagement portion 51 side. The length between the distal ends of the upper and lower second engagement portions 53 of the body 50 where the inclined surfaces and the perpendicular surfaces intersect each other is larger than the vertical length of the opening 7H formed in the attachment surface 7A for the rear plate 31 in the first cable unit 7. In this embodiment, the shape of a part of the body 50 from the pass-through portion 52 to the distal end surface 54 is identical to the shape of the pass-through portion 52 and is smaller than the shape of the opening 7H. The outer shape of the first engagement portion 51 is wider than that of the opening 7H and the first engagement portion 51 does not pass through the opening 7H.

When the cable connector 5 is attached to the attachment surface 7A for the rear plate 31 in the first cable unit 7, the body 50 of the cable connector 5 is inserted through the opening 7H and is directly pushed into the opening 7H. Then, the inclined surface of the second engagement portion 53 of the body 50 or the opening 7H is deformed and the second engagement portion 53 passes through the opening 7H. The perpendicular surface of the second engagement portion 53 moves to an outer side of the attachment surface 7A for the rear plate 31 in the first cable unit 7 and the pass-through portion 52 is located in the opening 7H. As described above, the length between the distal ends of the upper and lower second engagement portions 53 of the body 50 where the inclined surfaces and the perpendicular surfaces intersect each other is larger than the vertical length of the opening 7H. If the body 50 is formed of a resin, the second engagement portion 53 may be deformed and pass through the opening 7H when the second engagement portion 53 abuts the edge of the opening 7H.

Figure 8C:
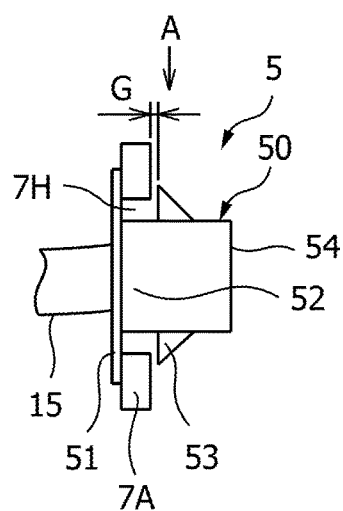
FIG. 8C is a sectional view of a state in which the cable connector is attached to the metal plate while being shifted from the state illustrated in FIG. 8B.
Figure 8D:
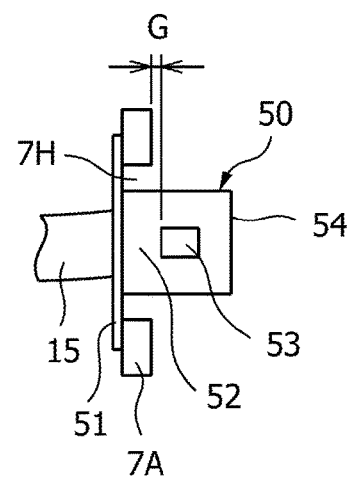
FIG. 8D is a view for the sectional view illustrated in FIG. 8C as seen in a direction indicated by the arrow A.

FIG. 8C and FIG. 8D illustrate a state in which the cable connector 5 is attached to the opening 7H formed in the attachment surface 7A for the rear plate 31 in the first cable unit 7. The distance between the perpendicular surface of the second engagement portion 53 and the first engagement portion 51, that is, the length of the pass-through portion 52, is larger than the thickness of the attachment surface 7A. Therefore, in a state in which the first engagement portion 51 abuts the attachment surface 7A, a gap G is present between the attachment surface 7A and the perpendicular surface of the second engagement portion 53.

Thus, in a state in which the attachment surface 7A is interposed between the first engagement portion 51 and the perpendicular surface of the second engagement portion 53, the pass-through portion 52 located in the opening 7H is slightly movable by an amount corresponding to the gap G in a direction to the first engagement portion 51 and in a direction to the second engagement portion 53. As described above, the first engagement portion 51 is wider than the opening 7H and the length between the distal ends of the second engagement portions 53 is larger than the vertical length of the opening 7H. Therefore, the cable connector 5 is not detached once the cable connector 5 is fitted to the opening 7H. That is, the second engagement portion 53 is formed to have such a length that, even in a state in which the pass-through portion 52 is adjacent to the edge of the opening 7H, the second engagement portion 53 located on the opposite surface of the body 50 does not pass through the opening 7H.

Figure 9:
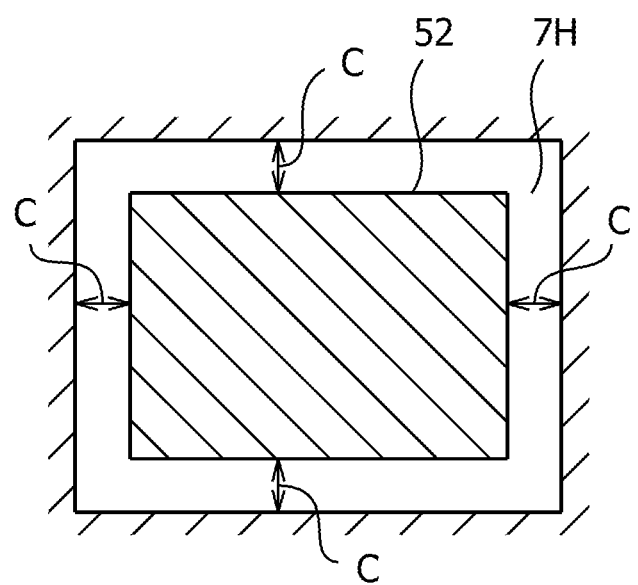
FIG. 9 is an explanatory view illustrating a clearance between a pass-through portion of the cable connector and an opening of the metal plate in the state illustrated in FIG. 8C.

As illustrated in FIG. 9, the shape of the pass-through portion 52 of the body 50 is smaller than the shape of the opening 7H. Therefore, a clearance C is present between the pass-through portion 52 and the opening 7H in the vertical and lateral directions. As described above, in the state in which the attachment surface 7A is interposed between the first engagement portion 51 and the perpendicular surface of the second engagement portion 53, the pass-through portion 52 located in the opening 7H is slightly movable by the amount corresponding to the gap G in the direction to the first engagement portion 51 and in the direction to the second engagement portion 53. Thus, in the state in which the cable connector 5 is attached to the opening 7H, the cable connector 5 is slightly movable in three directions that are vertical, lateral, and depth directions (X, Y, and Z directions, that is, three-dimensional directions). That is, when the cable connector 5 is fitted to the opening 7H, the cable connector 5 is held while being floatable in the three-dimensional directions.

Figure 10A:
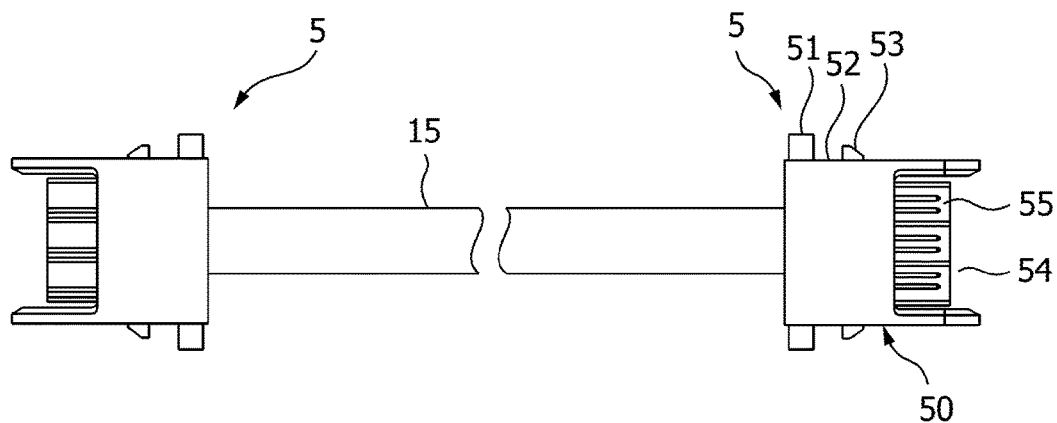
FIG. 10A is a plan view of a cable having the cable connectors attached to both ends thereof according to one embodiment.
Figure 10B:
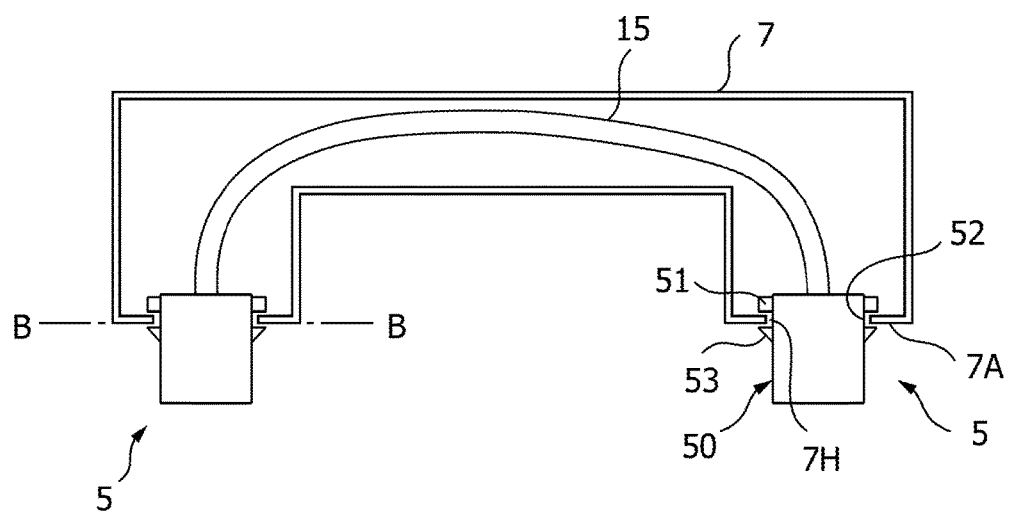
FIG. 10B is a horizontal sectional view illustrating the structure of the first cable unit according to the first embodiment.

FIG. 10A is a plan view illustrating the cable connectors 5 according to one embodiment, which are used in the first embodiment. The cable connectors 5 are attached to both ends of one cable 15. The cable connector 5 of this embodiment is a male connector and a male terminal 55 is arranged on the distal end surface 54. The first engagement portion 51 of the cable connector 5 of this embodiment is not arranged entirely around the body 50 but is arranged only on the same surface as the surface where the second engagement portion 53 is arranged. The cable 15 having the cable connectors 5 of the first embodiment that are arranged at both ends thereof as illustrated in FIG. 10A is attached to two openings 7H at the same stage in the first cable unit 7 as illustrated in FIG. 10B.

Figure 11A:
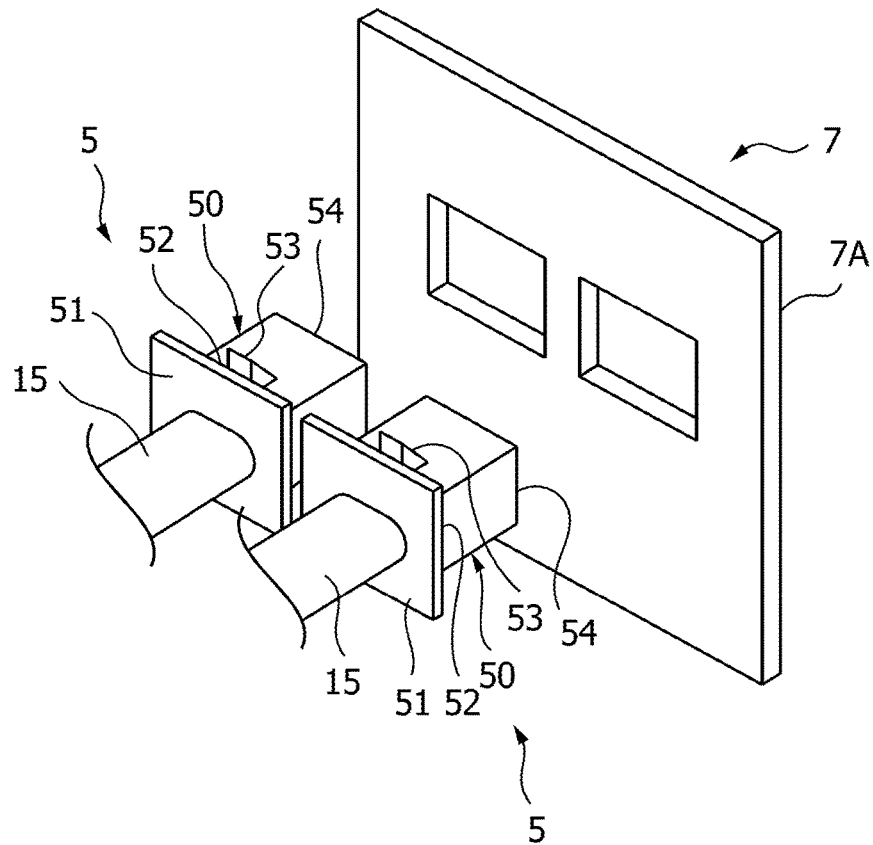
FIG. 11A is a perspective assembly view illustrating the structure of a cable connector in a structure for mounting a removable substrate according to a second embodiment, in which two cable connectors are attached to one stage in a metal plate.

FIG. 11A illustrates a structure for mounting the cable connector 5 according to a second embodiment. The second embodiment is different from the first embodiment in that two openings 7H are formed at one stage in the attachment surface 7A for the rear plate 31 in the first cable unit 7 and two cable connectors 5 are attached to the two openings 7H, respectively. The structure of the cable connector 5 and the structure of the opening 7H are identical to those of the first embodiment described above. Therefore, in the second embodiment, the same components as those of the first embodiment are denoted by the same reference symbols and description thereof is omitted.

Figure 11B:
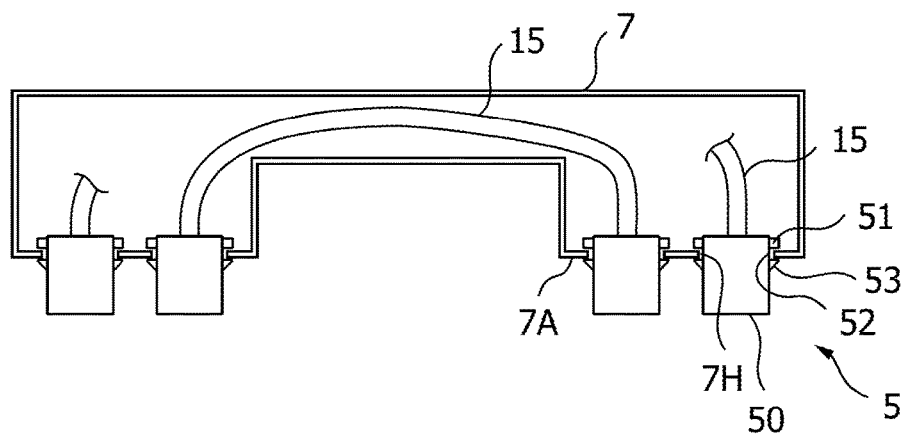
FIG. 11B is a horizontal sectional view illustrating the structure of a first cable unit according to the second embodiment.

FIG. 11B is a plan view illustrating the first cable unit 7 according to one embodiment, which is used in the second embodiment. A plurality of cables 15 are arranged in the first cable unit 7 and the cable connectors 5 are attached to both ends of each of the plurality of cables 15. In the second embodiment, one cable 15 having the cable connectors 5 at both ends thereof is attached to two openings 7H formed in different attachment surfaces 7A at the same stage in the first cable unit 7. The cable connectors 5 arranged at the other ends of two cables 15 that are attached to the remaining two openings 7H at the same stage are attached to openings 7H at a different stage or in a different first cable unit 7.

Figure 12:
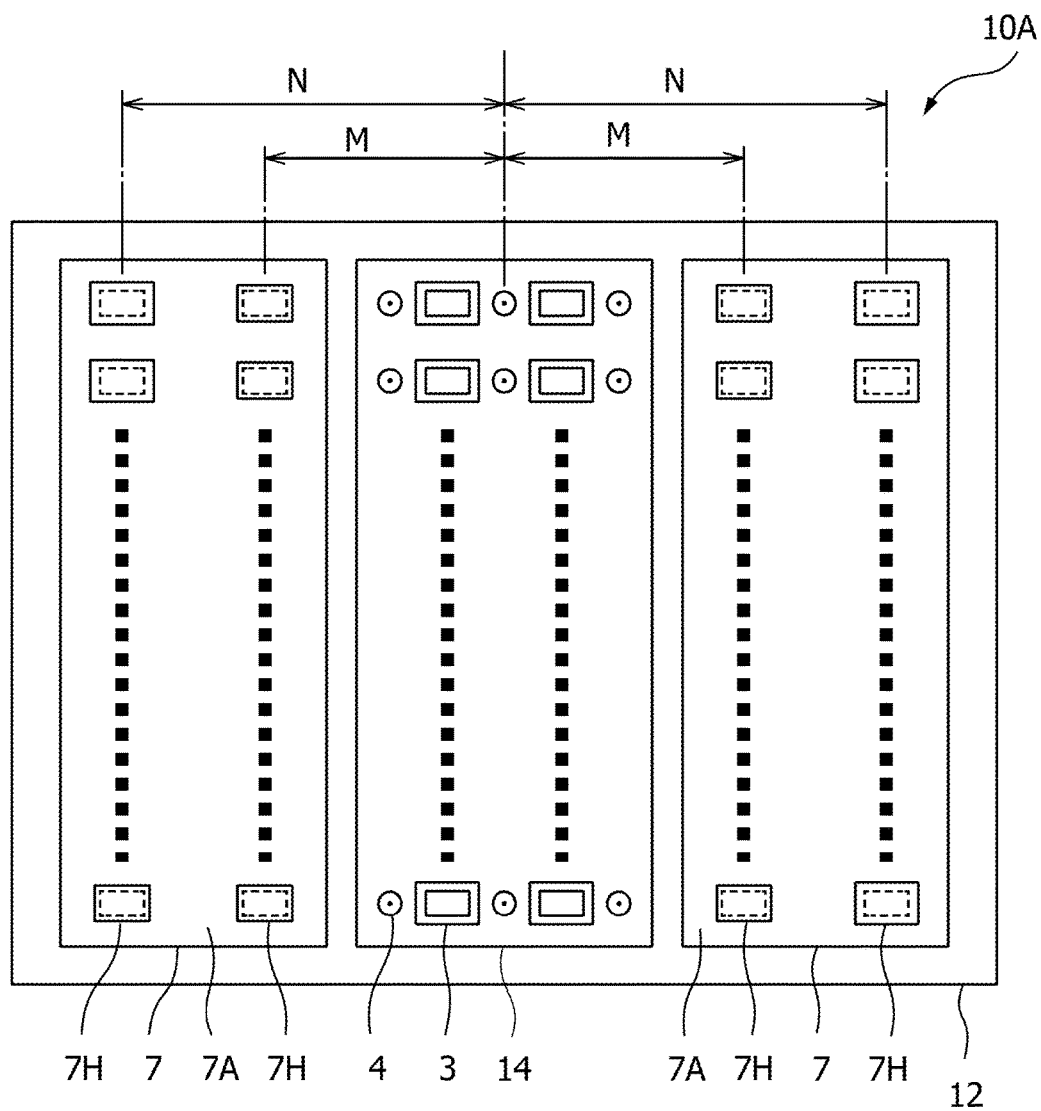
FIG. 12 is a front view of the internal structure of a rack in a state in which a module box is removed from a disclosed information processing apparatus according to the second embodiment.

FIG. 12 is a front view of the internal structure of the rack 12 in a state in which the module box 30 is removed from the information processing apparatus 10A according to the second embodiment. In the second embodiment, out of the two openings 7H formed in each of the two attachment surfaces 7A of the first cable unit 7, the opening 7H located at a longer distance N away from a central line CL of the BP 14 may be formed larger in size than the opening 7H located at a shorter distance M away from the central line CL of the BP 14. The reason is as follows. When the CPU board 11 fitted to the cable connectors 5 is inclined, the deviation of the cable connector 5A on the CPU board 11 that is located away from the central line CL of the BP 14 is larger than that of the cable connector 5A on the CPU board 11 that is located closer to the central line CL of the BP 14. Thus, it is desirable to secure a greater clearance.

Figure 13:
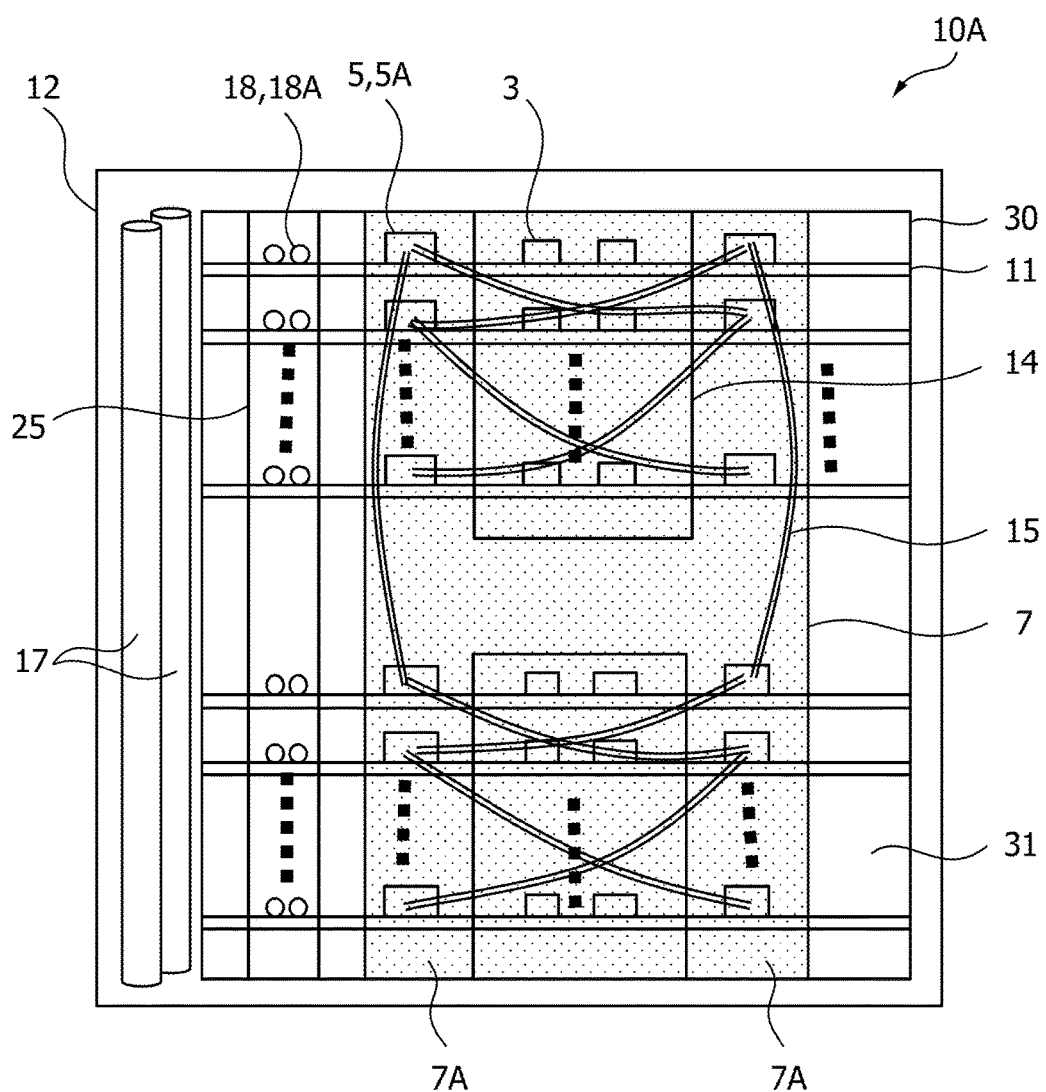
FIG. 13 is a schematic rear view of the information processing apparatus including the first cable unit according to the second embodiment.

FIG. 13 is a schematic rear view of the information processing apparatus 10A including the structure for mounting the cable connector 5 according to the second embodiment. In FIG. 13, the two openings 7H formed in each of the two attachment surfaces 7A of the first cable unit 7 and the two cable connectors 5 connected to the openings 7H are illustrated as one cable connector 5. FIG. 13 illustrates that two cables 15 are connected to one cable connector 5.

The module box 30 is arranged in the rack 12 and the pipes 17 for cooling water are arranged on the side of the module box 30. The first cable unit 7, the two BPs 14, and the branch pipe 25 are attached to the rear plate 31 of the module box 30. In this embodiment, illustration of the power unit 27 is omitted. A plurality of CPU boards 11 are mounted in the module box 30. The cable connectors 5 arranged on the first cable unit 7 are connected to the cable connectors 5A on the CPU boards 11 and the connectors 3 arranged on the two BPs 14 are connected to the connectors 3A on the CPU boards 11. The couplers 18 arranged on the branch pipe 25 are connected to the couplers 18A on the CPU boards 11.

In this embodiment, the cable 15 connected to the cable connector 5 arranged on one attachment surface 7A of the first cable unit 7 is not connected to the cable connector 5 arranged on the other attachment surface 7A at the same stage in the first cable unit 7. In this embodiment, the cable 15 connects the cable connectors 5 at different stages in the same attachment surface 7A or the cable connectors 5 at different stages in different attachment surfaces 7A. Thus, the positions of the cable connectors 5 connected by the cable 15 in the first cable unit 7 are not limited to the positions on the same attachment surface 7A.

Figure 14A:
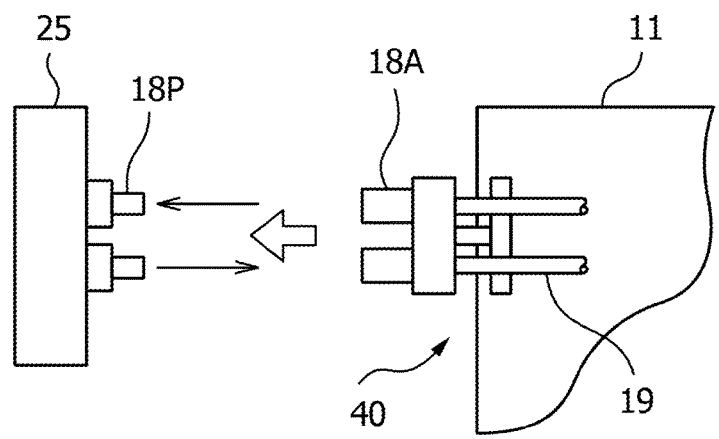
FIG. 14A is a partial plan view for describing connection of couplers that are connectors for cooling water in the disclosed information processing apparatus.
Figure 14B:
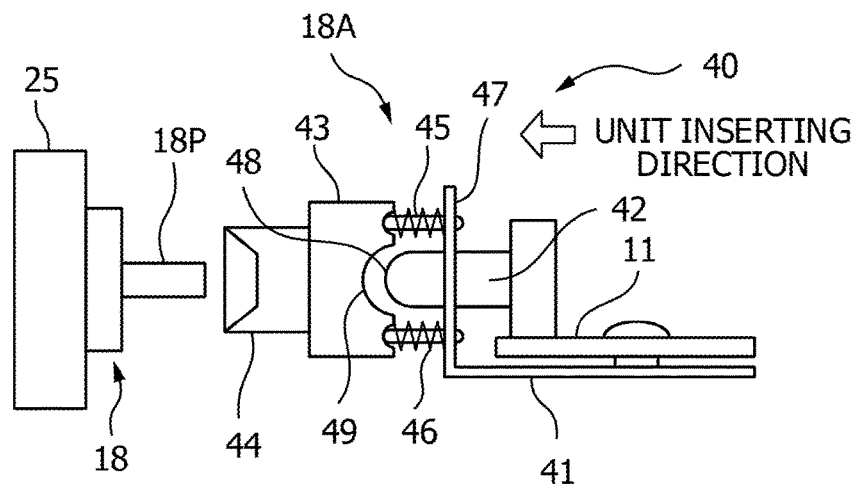
FIG. 14B is a structural view illustrating a shift mechanism for the couplers before fitting according to one embodiment.

FIG. 14A is a partial plan view for describing an example of connection of the couplers 18 and 18A that are connectors for cooling water in the disclosed information processing apparatus 10A. FIG. 14B is a structural view of the couplers 18A before fitting, illustrating a shift mechanism 40 for the couplers 18A arranged on the CPU board 11 according to one embodiment. The couplers 18 and 18A are located farthest away from a central part of the CPU board 11 and are therefore susceptible to inclination of the CPU board 11 during insertion. Thus, the shift mechanism 40 is arranged on the CPU board 11 so as to slightly shift the couplers 18A.

The shift mechanism 40 for the couplers 18A arranged on the CPU board 11 includes a base 41, a pressure pin 42, a coupler header 43, a coupler socket 44, pins 45, and springs 46. The couplers 18 arranged on the branch pipe 25 are fixed. The shift mechanism 40 for the couplers 18A which are arranged on the CPU board 11 and to which the conduits 19 are connected is slightly shifted in accordance with the inclination of the CPU board 11 to fit the couplers 18 and 18A together.

The base 41 is attached to the lower surface of the CPU board 11 and the distal end thereof is bent in a direction perpendicular to the CPU board 11 to form an attachment plate 47. On the CPU board 11, the pressure pin 42 protrudes so as to extend in a direction parallel to the CPU board 11. A shaft portion of the pressure pin 42 passes through the attachment plate 47 and the distal end of the pressure pin 42 is a spherical portion 48. The coupler header 43 including the coupler socket 44 is arranged on an outer side of the attachment plate 47 opposite the CPU board 11. A tapered hole is formed at the distal end of the coupler socket 44. On a side opposite the coupler socket 44 of the coupler header 43, the pins 45 are arranged so as to be swingable relative to their attachment portions. The pin 45 arranged on the coupler header 43 is inserted through the attachment plate 47 with the spring 46 wound around the pin 45, thereby changing the length of insertion of the pin 45 into the attachment plate 47. Coupler plugs 18P to be inserted into the coupler socket 44 are arranged on the couplers 18 of the branch pipe 25.

Figure 14C:
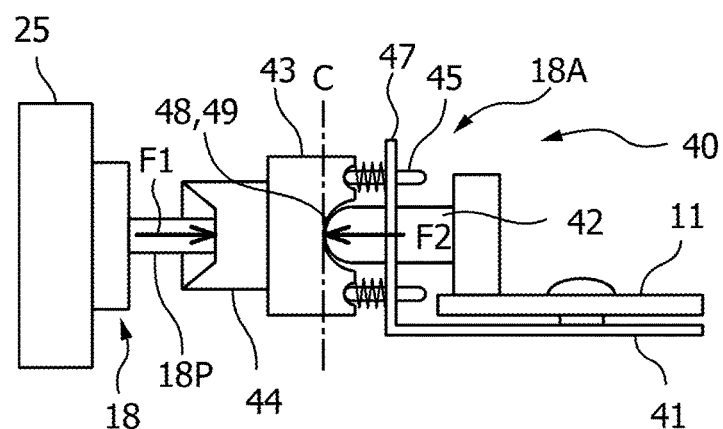
FIG. 14C is a structural view illustrating a state in which the couplers illustrated in FIG. 14B are fitted.

As illustrated in FIG. 14B, it is assumed that the CPU board 11 inserted into the information processing apparatus 10A approaches the branch pipe 25 in the perpendicular direction with no inclination. In this case, as illustrated in FIG. 14C, the coupler plugs 18P arranged on the couplers 18 of the branch pipe 25 are properly coupled to the coupler socket 44 of the shift mechanism 40 and the spherical portion 48 of the pressure pin 42 is fitted to a spherical bearing 49 of the coupler header 43 at a fitting position C. In this state, the pins 45 move relative to the attachment plate 47 and the upper and lower springs 46 contract to the same degree. In the coupler header 43, a pressing load F2 generated by the pressure pin 42 and a pressing load F1 generated by the coupler plugs 18P are balanced and the fitting position C is determined.

Figure 14D:
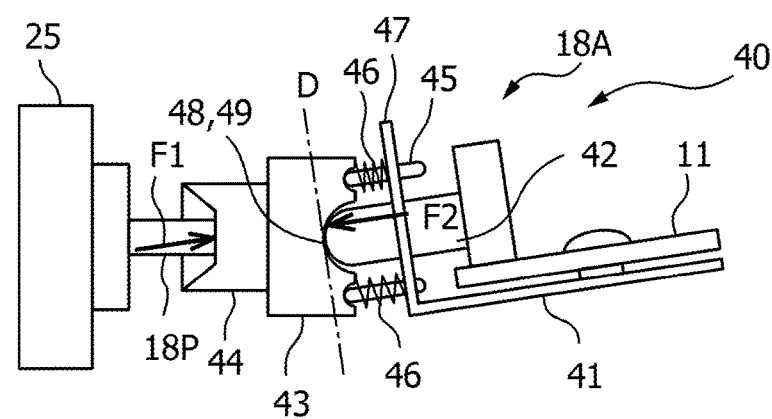
FIG. 14D is a structural view illustrating an operation of the shift mechanism when the substrate is inclined.

It is assumed that the CPU board 11 inserted into the information processing apparatus 10A approaches the branch pipe 25 while being inclined from the perpendicular direction. In this case, as illustrated in FIG. 14D, a fitting position D of the spherical portion 48 of the pressure pin 42 is inclined with respect to the branch pipe 25 but the pins 45 arranged on the coupler header 43 are inclined to change the degrees of contraction of the upper and lower springs 46. The spherical portion 48 of the pressure pin 42 is fitted to the spherical bearing 49 of the coupler header 43 in a state in which the pressure pin 42 is inclined. As a result, the coupler plugs 18P arranged on the couplers 18 of the branch pipe 25 may properly be coupled to the coupler socket 44 of the shift mechanism 40. Also in this state, in the coupler header 43, the pressing load F2 generated by the pressure pin 42 and the pressing load F1 generated by the coupler plugs 18P are balanced and the fitting position D is determined.

Owing to the shift mechanism 40, the fitting portion of the couplers 18A has a six-axis movable structure that allows angular floating in addition to three-axis movement (vertical, lateral, and depth directions). That is, the pins 45 and the springs 46 are arranged on the coupler header 43 and the spherical portion 48 is arranged at the distal end of the pressure pin 42, thereby absorbing vertical, lateral, depth, and angular deviations during the insertion of the CPU board 11.

Figure 15A:
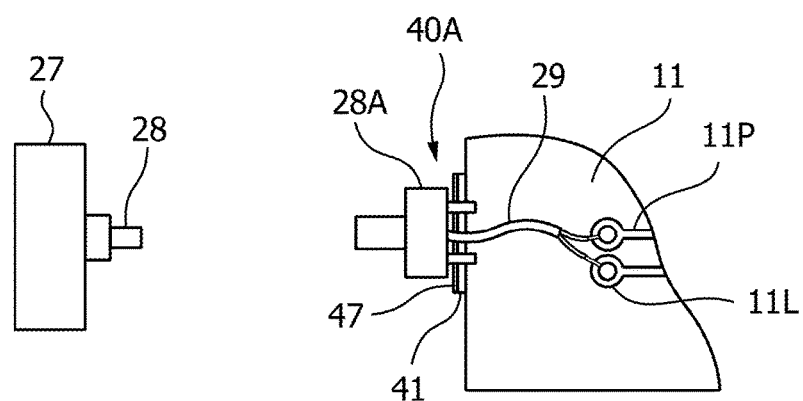
FIG. 15A is a partial plan view for describing connection of power connectors of a power unit and the substrate in the disclosed information processing apparatus.
Figure 15B:
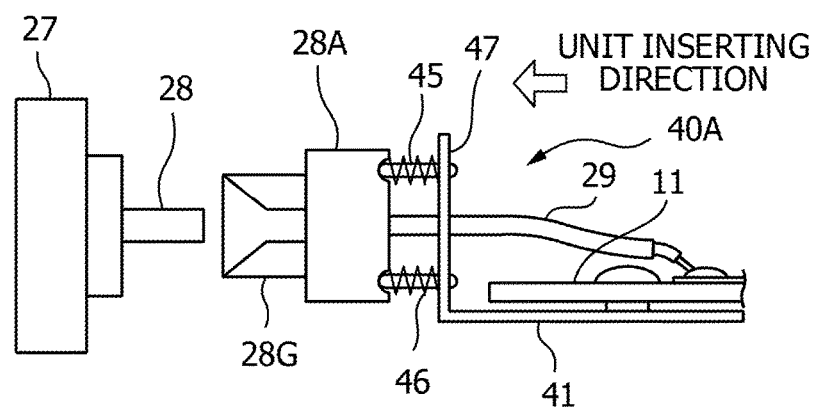
FIG. 15B is a structural view illustrating a shift mechanism for the power connector before fitting according to one embodiment.

FIG. 15A is a partial plan view for describing an example of connection of the power connector 28 of the power unit 27 and the power connector 28A of the CPU board 11 in the disclosed information processing apparatus 10A. FIG. 15B is a structural view of the power connectors 28 and 28A before fitting, illustrating a shift mechanism 40A for the power connector 28A arranged on the CPU board 11 according to one embodiment. The power connectors 28 and 28A are also located farthest away from the central part of the CPU board 11 and are therefore susceptible to the inclination of the CPU board 11 during the insertion. Thus, the shift mechanism 40A is arranged on the CPU board 11 so as to slightly shift the power connector 28A.

The shift mechanism 40A for the power connector 28A arranged on the CPU board 11 includes a base 41, an attachment plate 47 continuous with the base 41, four pins 45 movable relative to the attachment plate 47, springs 46 arranged around the pins 45, and a guide member 28G. The power connector 28 arranged on the power unit 27 is fixed. The power connector 28A arranged on the CPU board 11 may slightly be shifted by the shift mechanism 40A.

The base 41 is attached to the lower surface of the CPU board 11 and the distal end of the base 41 is bent in a direction perpendicular to the CPU board 11 to form the attachment plate 47. Lands 11L connected to a power pattern 11P are formed on the CPU board 11. A power wire 29 from the power connector 28A is connected to the lands 11L by soldering. The guide member 28G having a tapered hole to serve as a guide to proper fitting of the power connector 28 to the power connector 28A is arranged on the power unit 27 side of the power connector 28A.

Figure 15C:
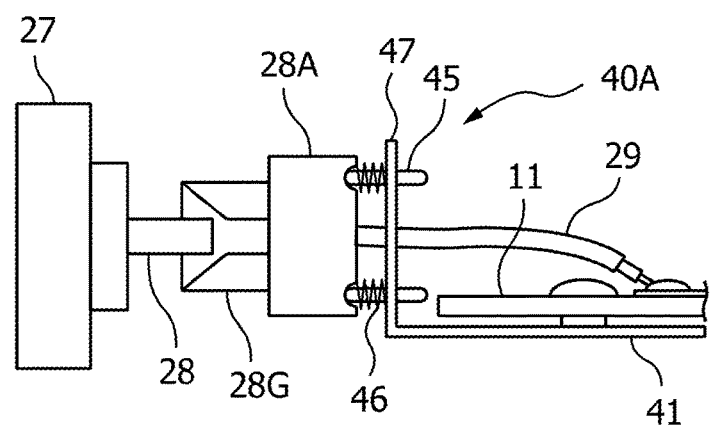
FIG. 15C is a structural view illustrating a state immediately before the power connector illustrated in FIG. 15B is fitted properly.

As illustrated in FIG. 15B, it is assumed that the CPU board 11 inserted into the information processing apparatus 10A approaches the power unit 27 in the perpendicular direction. In this case, as illustrated in FIG. 15C, the power connector 28 arranged on the power unit 27 is inserted straight into the guide member 28G of the shift mechanism 40A. Therefore, the power connector 28 is properly coupled to the power connector 28A arranged on the CPU board 11. In this state, the pins 45 are inserted through the attachment plate 47 perpendicularly to the power connector 28A and the upper and lower springs 46 contract to the same degree.

Figure 15D:
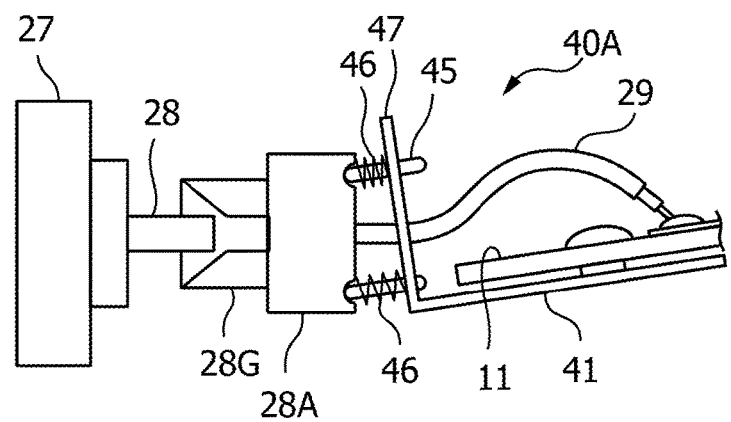
FIG. 15D is a structural view illustrating an operation of the shift mechanism when the power connector illustrated in FIG. 15B is inserted into the information processing apparatus while being inclined.

It is assumed that the CPU board 11 inserted into the information processing apparatus 10A approaches the power unit 27 while being inclined from the perpendicular direction. In this case, as illustrated in FIG. 15D, the power connector 28A is inclined in a state in which the power connector 28 is inserted into the tapered hole of the guide member 28G. The pins 45 are inclined with respect to the power connector 28A to change the degrees of contraction of the upper and lower springs 46. The power connector 28A is fitted to the power connector 28 in a state in which the power connector 28A is inclined with respect to the attachment plate 47. As a result, the power connector 28 arranged on the power unit 27 may properly be coupled to the power connector 28A arranged on the CPU board 11 by the shift mechanism 40A.

Owing to the shift mechanism 40A, the fitting portion of the power connector 28A and the power connector 28 has a six-axis movable structure that allows angular floating in addition to three-axis movement (vertical, lateral, and depth directions). That is, the shift mechanism 40A is arranged on the power connector 28A side, thereby absorbing vertical, lateral, depth, and angular deviations between the power connector 28 and the power connector 28A even if the CPU board 11 is inserted while being inclined and the power connector 28A is inclined with respect to the power connector 28.

Figure 16:
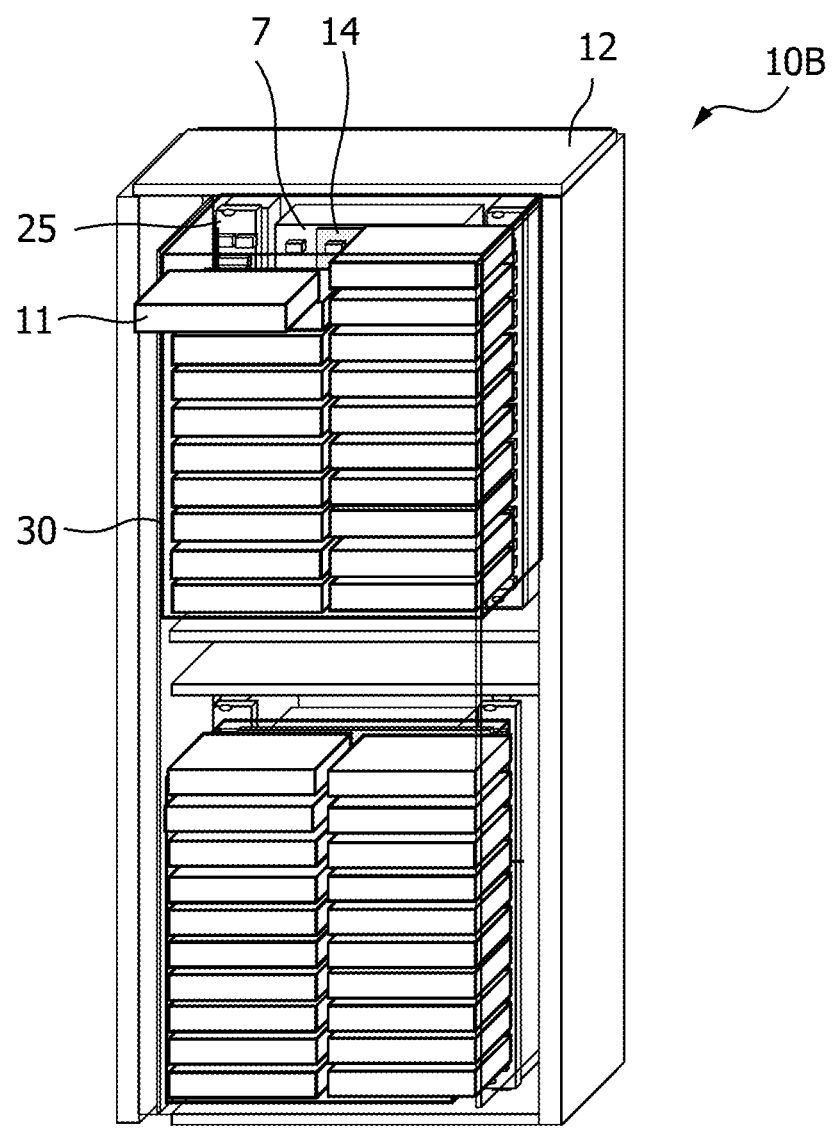
FIG. 16 is a perspective view illustrating the overall structure of a disclosed information processing apparatus of a second mode.
Figure 17:
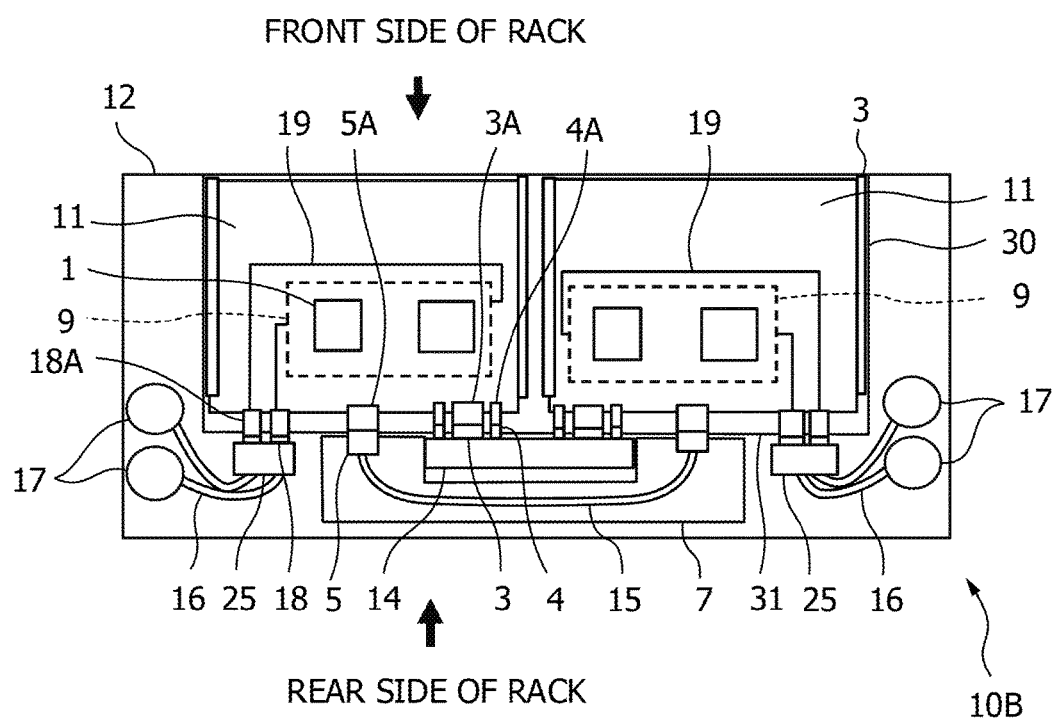
FIG. 17 is a horizontal sectional view of the information processing apparatus of the second mode illustrated in FIG. 16, illustrating the structure of arrangement of connectors at one stage in the information processing apparatus according to a third embodiment.

FIG. 16 illustrates the overall structure of a disclosed information processing apparatus 10B of a second mode. FIG. 17 illustrates a structure for mounting a removable substrate included in the information processing apparatus 10B of the second mode according to a third embodiment. FIG. 17 illustrates the structure of one stage in the information processing apparatus 10B illustrated in FIG. 16.

As illustrated in FIG. 16, the module box 30 open to a front side of the information processing apparatus 10B is fixed to the rack 12 of the information processing apparatus 10B. The inside of the module box 30 is partitioned in the vertical direction by an inner wall into right and left sections. On the inner walls that face each other, guide members such as rails extending in the depth direction are arranged at a plurality of stages. A plurality of CPU boards 11 are inserted into the module box 30 while being guided by the guide members from the front side of the information processing apparatus 10B and are mounted in a stacked state. In the information processing apparatus 10B of the second mode, two CPU boards 11 are mounted in parallel at one stage.

As illustrated in FIG. 17, two pipes 17 where cooling water flows from the cooling device 80 (see FIG. 7) are arranged in a space between the rack 12 and each side of the module box 30 and are connected to the branch pipe 25 by the connection hoses 16, respectively. A plurality of CPUs 1 are mounted on the CPU board 11. At the position where the CPUs 1 are mounted, the cooling plate 9 is arranged so as to cool the CPUs 1. The inlet and the outlet of the cooling water in the cooling plate 9 are connected to the couplers 18A by the conduits 19. The cooling water flowing through the branch pipe 25 is split to circulate through the cooling plate 9. Even when two CPU boards 11 are mounted in the module box 30, one BP 14 that extends over the two CPU boards 11 is attached to the rear plate 31. Only one first cable unit 7 is attached to the rear plate 31 so as to extend over the BP 14.

The connector 3A to be fitted to the connector 3 arranged on the BP 14 and the guide pins 4A arranged on both sides of the connector 3A are mounted on the edge of the CPU board 11 that faces the BP 14. The cable connector 5A to be fitted to the cable connector 5 protruding from the first cable unit 7 attached to the rear plate 31 of the module box 30 is mounted on the edge of the CPU board 11 that is adjacent to the connector 3A and the guide pins 4A. The couplers 18A to be fitted to the couplers 18 protruding from the rear plate 31 of the module box 30 are mounted on the edge of the CPU board 11 on the branch pipe 25 side.

Similarly to the information processing apparatus 10A, two BPs 14 are fixed to the rear plate 31 in the vertical direction. The connectors 3 and the guide pins 4 similar to the connectors 3 and the guide pins 4 attached to the BP 14 described in the comparative technology are arranged on each BP 14 for two CPU boards 11. When the BPs 14 are attached to the rear plate 31, the connectors 3 and the guide pins 4 arranged on the BPs 14 protrude to the inner side of the rear plate 31. When two CPU boards 11 are inserted at one stage in the module box 30, the connectors 3A arranged on the CPU boards 11 are positioned by the guide pins 4 and 4A and are fitted to the connectors 3 protruding from the rear plate 31.

The first cable unit 7 attached to the rear side of the rear plate 31 is identical to the first cable unit 7 that is used in the information processing apparatus 10A of the first mode. The information processing apparatus 10B of the second mode is different from the information processing apparatus 10A of the first mode in that the cable connectors 5 attached to the two attachment surfaces 7A for the rear plate 31 in the first cable unit 7 are connected to different CPU boards 11 at the same stage. Similarly to the information processing apparatus 10A of the first mode, the two cable connectors 5 arranged at the same stage in the first cable unit 7 are connected together by the cable 15 in the first cable unit 7.

Figure 18:
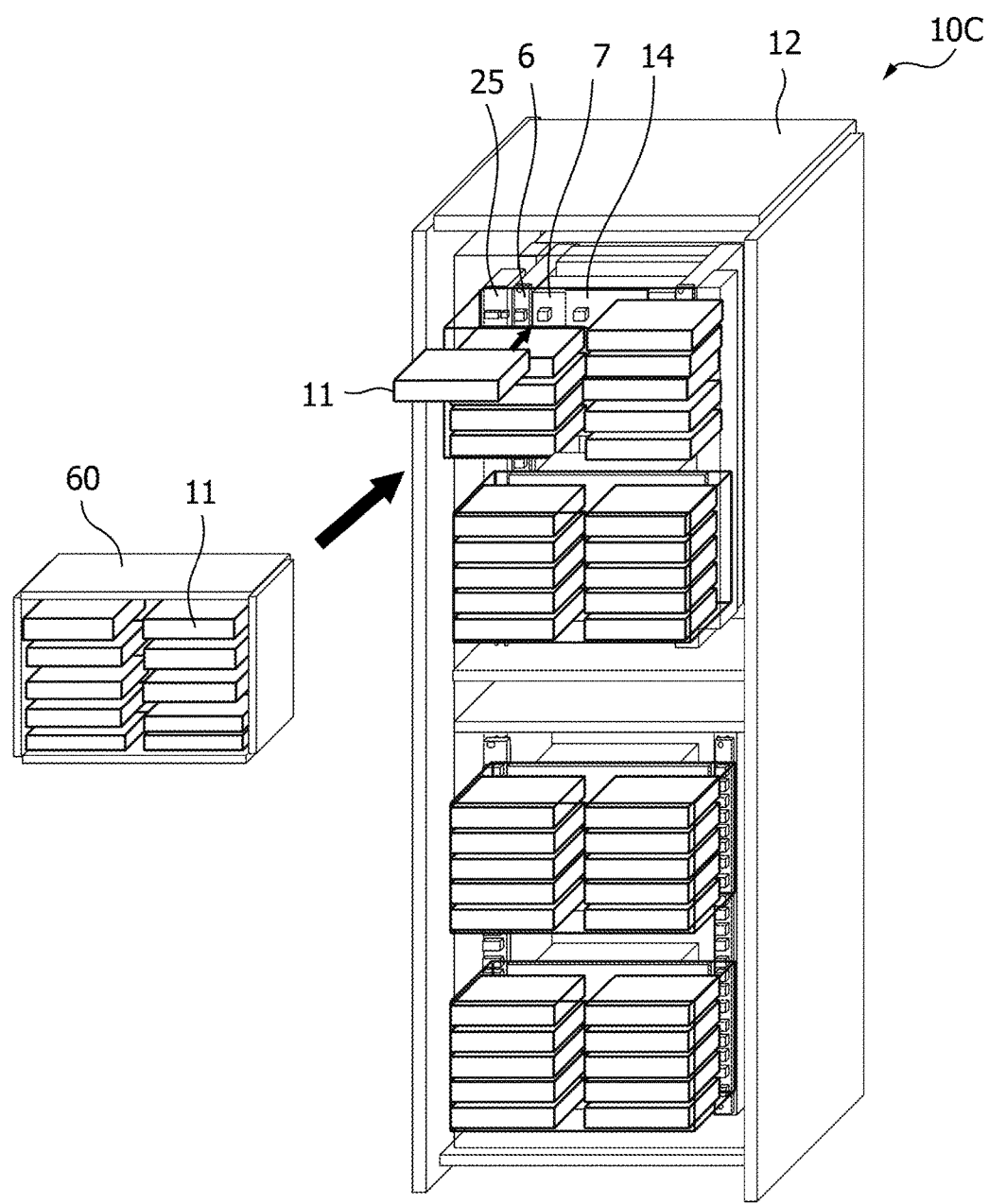
FIG. 18 is a perspective view illustrating the overall structure of a disclosed information processing apparatus of a third mode.
Figure 19:
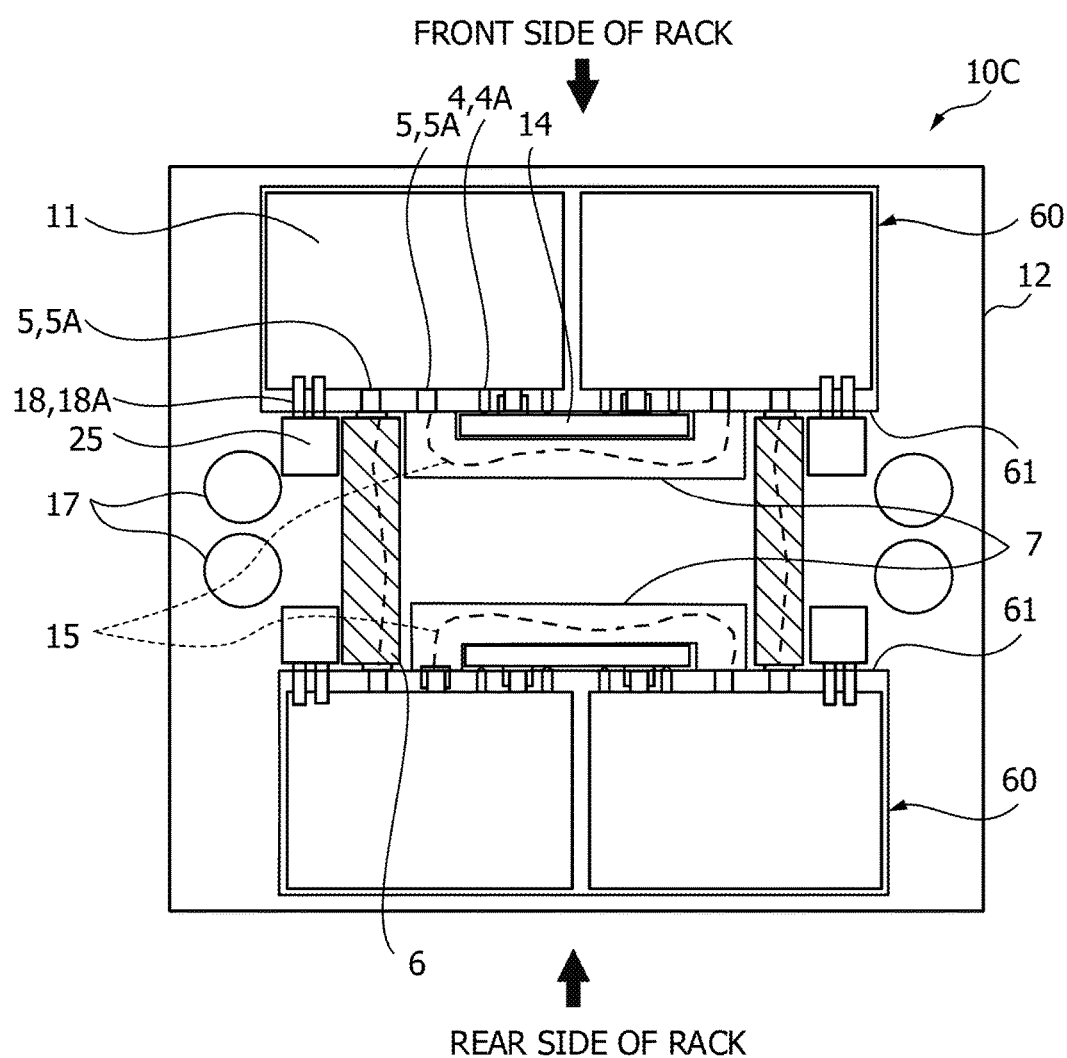
FIG. 19 is a horizontal sectional view of the information processing apparatus of the third mode illustrated in FIG. 18, illustrating a structure for mounting a removable substrate at one stage in the information processing apparatus according to a fourth embodiment.

FIG. 18 is a perspective view illustrating the overall structure of an information processing apparatus 10C of a third mode. FIG. 19 illustrates an example of a structure for mounting a removable substrate included in the information processing apparatus 10C of the third mode according to a fourth embodiment. FIG. 19 illustrates the structure of one stage in the information processing apparatus 10C illustrated in FIG. 18.

As illustrated in FIG. 18, in place of the module box 30, a plurality of shelves 60 are inserted from both the front side and the rear side of the information processing apparatus 10C and are fixed in a stacked state to the rack 12 of the information processing apparatus 10C. The inside of the shelf 60 is partitioned in the vertical direction by an inner wall into right and left sections. On the inner walls that face each other, guide members such as rails extending in the depth direction are arranged at a plurality of stages. The shelf 60 may house a plurality of CPU boards 11 in parallel. Thus, in the information processing apparatus 10C of the third mode, the shelf 60 corresponds to the module box 30 in the information processing apparatus 10B of the second mode.

As illustrated in FIG. 19, the information processing apparatus 10C of the third mode is constructed such that the information processing apparatuses 10B of the second mode are housed in one rack 12 with their rear sides facing each other. In the information processing apparatus 10C of the third mode, only one set of pipes 17 is arranged on each side of the rack 12 in the lateral direction. Therefore, in the information processing apparatus 10C of the third mode, the same components as those of the information processing apparatus 10B of the second mode are denoted by the same reference symbols and description thereof is omitted.

The information processing apparatus 10C of the third mode is different from the information processing apparatus 10B of the second mode in that second cable units 6 are arranged between rear plates 61 of the shelves 60 of devices corresponding to two information processing apparatuses 10B of the second mode that face each other. Holes similar to the holes formed in the rear plate 31 of the module box 30 described above are formed in the rear plate 61 of the shelf 60. The cable connector 5 arranged on an attachment surface for the rear plate 61 of the shelf 60 in the second cable unit 6 protrudes from the hole into the shelf 60. Two second cable units 6 are attached to the rear plates 61 of the shelves 60. The cable connectors 5A mounted on the CPU boards 11 inserted into the shelves 60 are connected together by the cable 15.

Figure 20A:
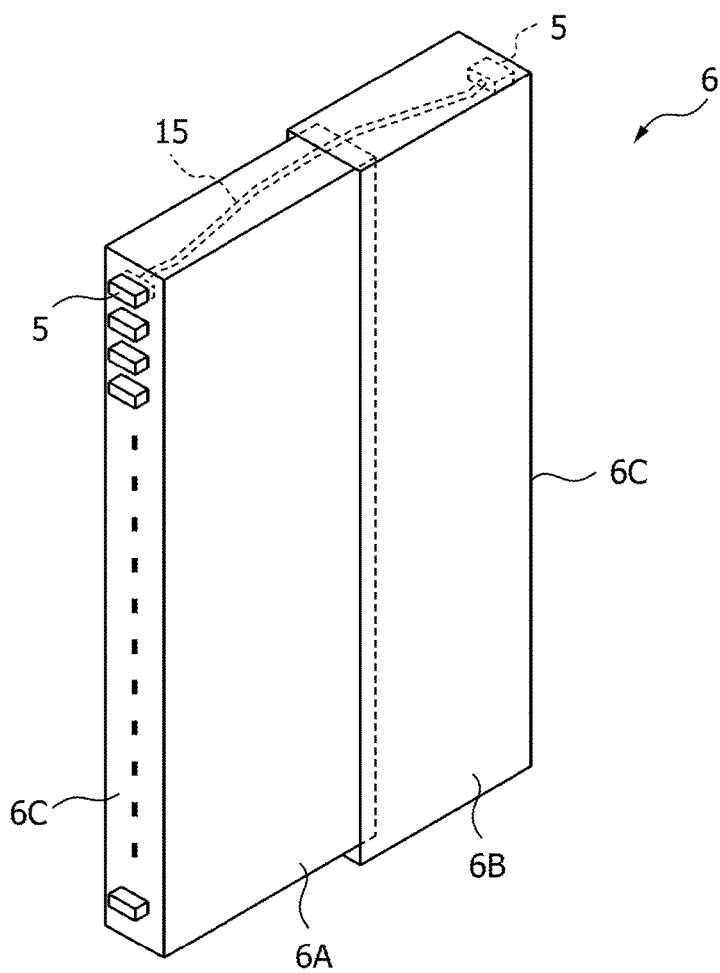
FIG. 20A is a perspective view illustrating the structure of a second cable unit in the information processing apparatus of the third mode.
Figure 20B:
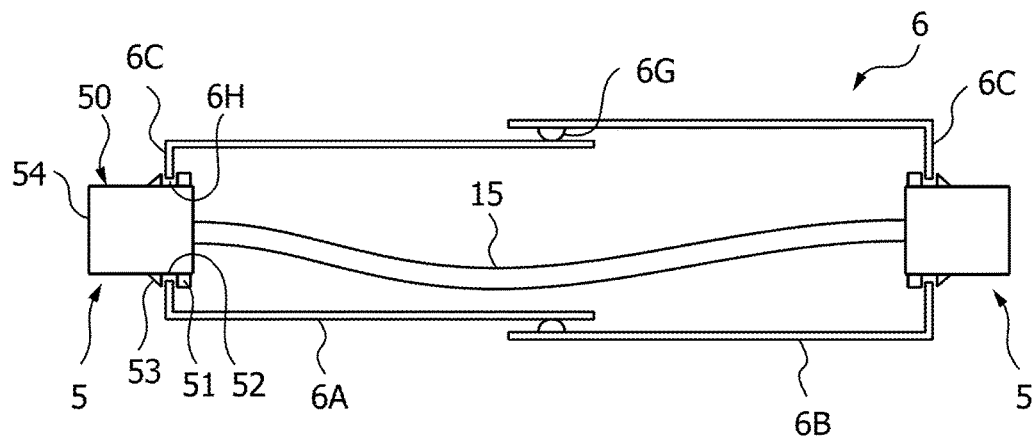
FIG. 20B is a horizontal sectional view of the second cable unit illustrated in FIG. 20A.

FIG. 20A is a perspective view illustrating an example of the structure of the second cable unit 6 in the information processing apparatus 10C of the third mode. FIG. 20B is a horizontal sectional view of the second cable unit 6 illustrated in FIG. 20A. The second cable unit 6 includes two housings that are an inner housing 6A and an outer housing 6B. The inner housing 6A and the outer housing 6B overlap each other such that the open end of the inner housing 6A enters the open end of the outer housing 6B. A seal gasket 6G is arranged at a part where the inner housing 6A and the outer housing 6B overlap each other. In actuality, a slide mechanism is arranged between the inner housing 6A and the outer housing 6B so as to smooth movement of the inner housing 6A relative to the outer housing 6B. Illustration of the slide mechanism is omitted from FIG. 20A and FIG. 20B.

The cable connectors 5 arranged at both ends of a cable 15 similar to the cable 15 illustrated in FIG. 10A are attached to attachment surfaces 6C for the shelves 60 in the inner housing 6A and the outer housing 6B. Openings 6H formed in the attachment surfaces 6C for the shelves 60 in the inner housing 6A and the outer housing 6B are similar to the opening 7H formed in the attachment surface 7A for the module box 30 in the first cable unit 7. The cable connectors 5 arranged at both ends of the cable 15 are attached to the openings 6H in a slightly movable manner. Since the structure of the cable connector 5 has already been described, reference symbols are only assigned to the respective portions of the cable connector 5 and description thereof is omitted. Thus, the cable connectors 5 are slightly movable in the vertical and lateral directions on the attachment surfaces 6C for the shelves 60 in the inner housing 6A and the outer housing 6B.

Figure 21:
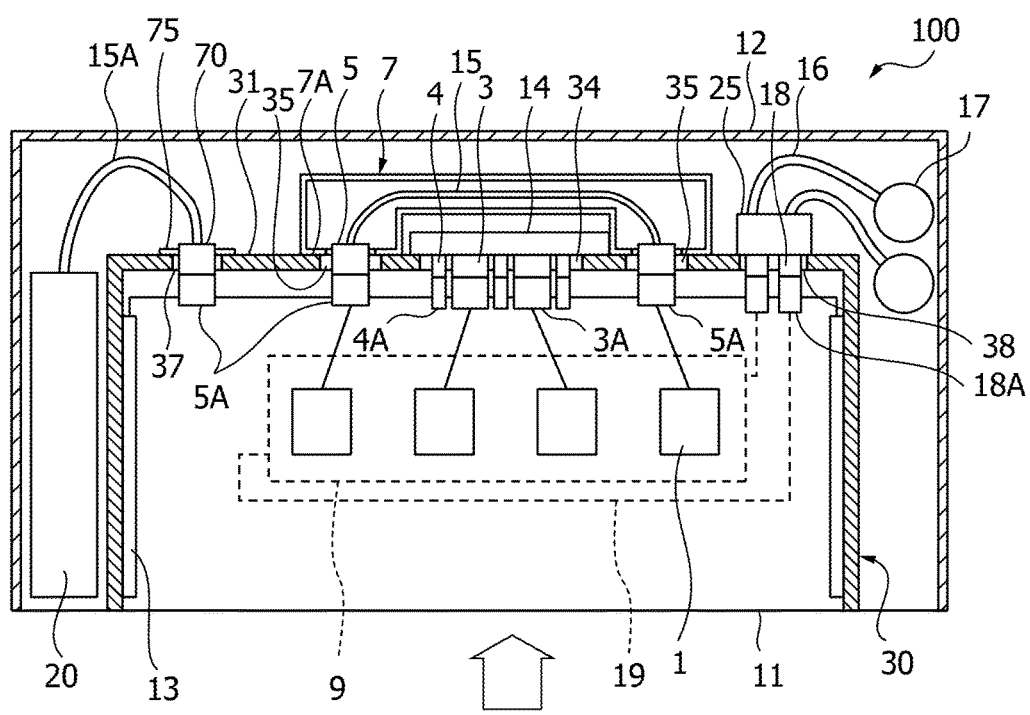
FIG. 21 is a horizontal sectional view of an information processing apparatus, illustrating a disclosed structure for mounting a removable substrate according to a fifth embodiment.

FIG. 21 is a horizontal sectional view of an information processing apparatus 10D including a structure for mounting a removable substrate according to a fifth embodiment. In the fifth embodiment, in place of the power unit 27 in the structure of the first embodiment described above, an input and output device (hereinafter referred to as an I/O device) 20 is arranged in the information processing apparatus 10D. The I/O device 20 and the CPU board 11 are connected together by a cable 15A. A movable connector 70 attached to a connector attachment plate 75 is arranged on the cable 15A on a side connected to the CPU board 11. The connector attachment plate 75 is fixed to the rear plate 31 of the module box 30. The structure of the movable connector 70 according to one embodiment and the connector attachment plate 75 are described with reference to FIG. 22A to FIG. 22D.

The movable connector 70 is slightly movable relative to the connector attachment plate 75. The movable connector 70 protruding from the connector attachment plate 75 protrudes into the module box 30 through an I/O hole 37 formed in the rear plate 31 of the module box 30. The movable connector 70 protruding into the module box 30 is fitted to the cable connector 5A mounted on the CPU board 11. Other features of the structure for mounting the removable substrate according to the fifth embodiment are identical to the features of the structure for mounting the removable substrate according to the first embodiment and therefore description thereof is omitted.

Figure 22A:
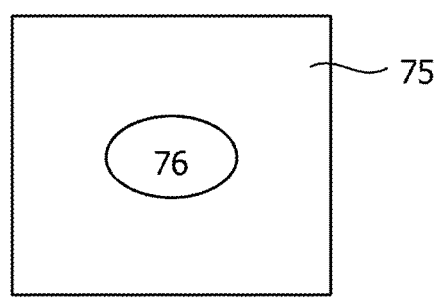

FIG. 22A to FIG. 22D are views for describing the movable connector 70 that is newly arranged in the structure for mounting the removable substrate according to the fifth embodiment. FIG. 22A illustrates an opening 76 formed in the connector attachment plate (metal plate) 75 according to one embodiment. In this embodiment, the opening 76 has an elliptical shape. As exemplified in FIG. 22B, the movable connector 70 includes a connector guide 71 to which the cable 15A is connected, a pass-through body 72 to be located in the opening 76, and a connector body 73. The pass-through body 72 has a circular shape in cross section and the radius of the pass-through body 72 is set smaller than the minor radius of the elliptical opening 76.

Figure 22B:
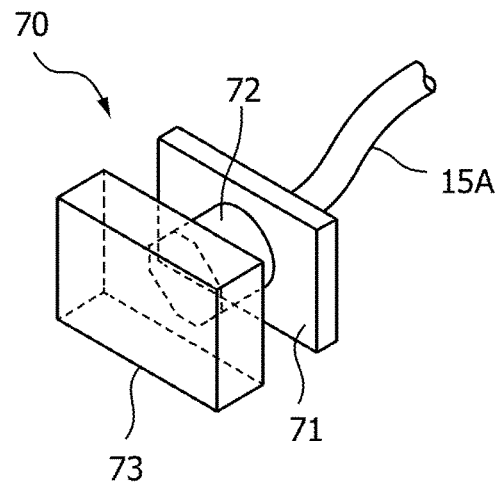
Figure 22C:
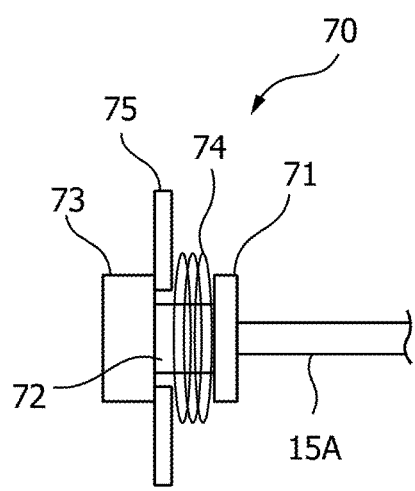
Figure 22D:
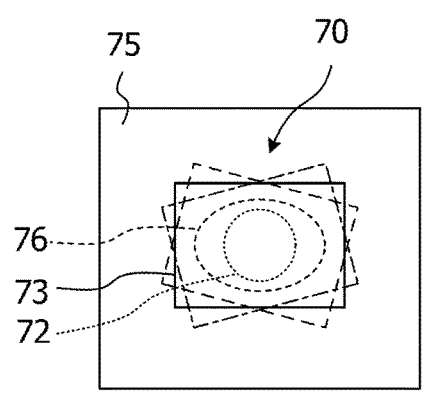

FIG. 22C is a vertical sectional view of the connector attachment plate 75 when the movable connector 70 illustrated in FIG. 22B is attached to the connector attachment plate 75 in a state in which the pass-through body 72 is inserted through the opening 76. In the state in which the movable connector 70 is attached to the connector attachment plate 75, a spring 74 is arranged around the pass-through body 72 at a part between the connector attachment plate 75 and the connector guide 71. With this structure, the movable connector 70 is slightly movable in longitudinal, vertical, and lateral directions relative to the connector attachment plate 75. As illustrated in FIG. 22D, the movable connector 70 is also rotatable (pivotable) relative to the connector attachment plate 75. Thus, the movable connector 70 may be fitted to the cable connector 5A mounted on the CPU board 11 even if the CPU board 11 is inclined in the module box 30.

Figure 23A:
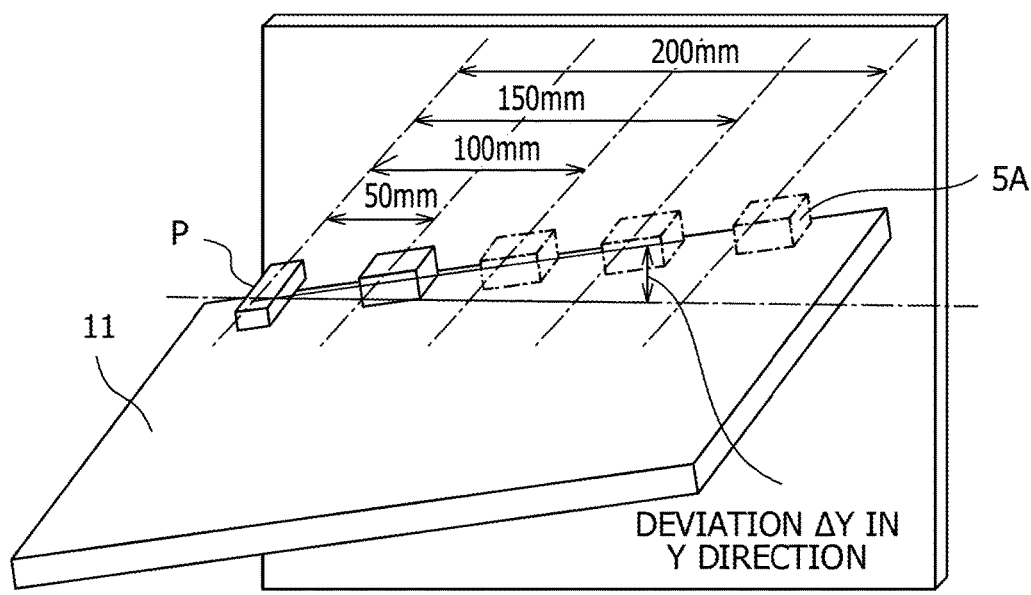
FIG. 23A is a view illustrating results of simulation for investigating the degree of a deviation in a Y direction relative to a distance from a reference pin when the substrate is inclined.
Figure 23B:
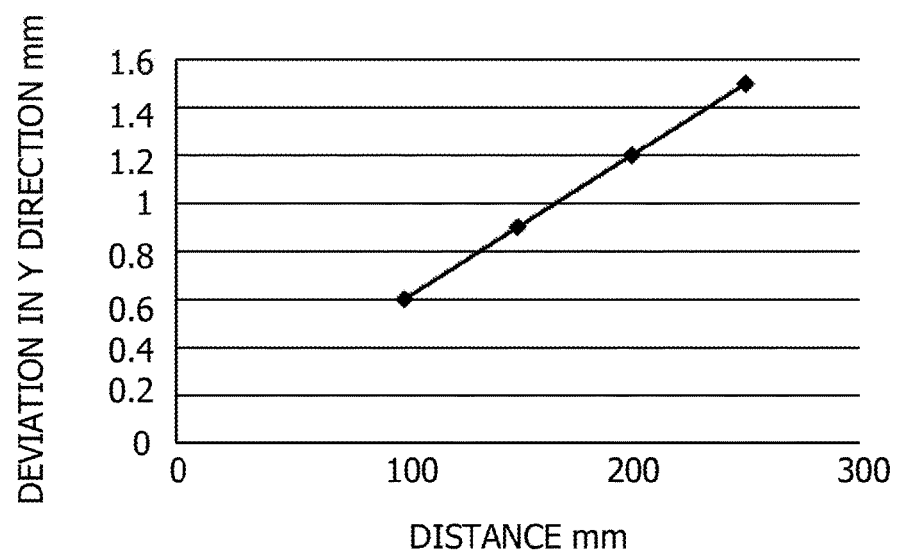
FIG. 23B is a graph illustrating an example of the degree of the deviation in the Y direction relative to the distance from the reference pin when the substrate is inclined.

FIG. 23A is a view illustrating results of simulation for investigating the degree of a deviation $\Delta Y$ of the cable connector 5A in the Y direction (vertical direction) relative to a distance from a reference pin P for substrate mounting. FIG. 23B is a graph illustrating an example of the degree of the deviation $\Delta Y$ in the Y direction when the cable connector 5A is mounted relative to the distance from the reference pin P. The results of simulation indicate only the deviation $\Delta Y$ of the cable connector 5A in the Y direction but similarly indicate a deviation $\Delta X$ in the X direction (lateral direction) and a deviation $\Delta Z$ in the Z direction (depth direction).

When the distance from the reference pin P is equal to or shorter than 100 mm, the deviations $\Delta$ of the cable connector 5A in the X, Y, and Z (vertical, lateral, and depth) directions are about ±0.6 mm based on the results of simulation. When the cable connector 5 has the structure illustrated in FIG. 8A to FIG. 8D for the X and Y directions, the deviations $\Delta X$ and $\Delta Y$ of the cable connector 5A are absorbed by the floating of the cable connector 5 in the opening 7H. The deviation $\Delta Z$ of the cable connector 5A in the Z direction may be absorbed at 1.00 mm that is a normal effective connector fitting length of the cable connector 5. The cable connector 5 illustrated in FIG. 8A to FIG. 8D has a floating structure along three axes in the X, Y, and Z directions.

When the distance from the reference pin P falls within a range from 100 mm to 150 mm, the mounting deviations $\Delta$ of the cable connector 5A in the X, Y, and Z (vertical, lateral, and depth) directions are about ±0.9 mm. In this case, the deviations $\Delta X$ and $\Delta Y$ are absorbed by increasing the clearance C between the cable connector 5 and the opening 7H in accordance with the distance as in the structure of the embodiment illustrated in FIG. 8A to FIG. 9 for two axes in the X and Y directions of the cable connector 5. The deviation $\Delta Z$ is not absorbable at 1.00 mm that is a normal effective connector fitting length of the cable connector 5A. In this case, the deviation $\Delta Z$ of the cable connector 5A in the Z direction may be absorbed by extending the movable range of the cable connector 5 by the spring 74 in the structure illustrated in FIG. 22C or by employing the movable structure of the second cable unit 6 in the longitudinal direction that is illustrated in FIG. 20A and FIG. 20B. The cable connector 5 has a floating structure along three axes in the X, Y, and Z directions.

When the distance from the reference pin P falls within a range from 150 mm to 200 mm, the mounting deviations $\Delta$ of the cable connector 5A in the X, Y, and Z (vertical, lateral, and depth) directions are about ±1.2 mm. In this case, it is desirable for the cable connector 5 to absorb the rotational deviations illustrated in FIG. 22A to FIG. 22D in addition to the absorption of the deviations in the X, Y, and Z directions. In FIG. 22A to FIG. 22D, the cable connector 70 has a six-axis floating structure with a floating structure in the rotational directions (rotations about the three-axis directions) in addition to the floating structure in the X, Y, and Z directions (movements in the three-axis directions).

In the movable connector 70 illustrated in FIG. 22A to FIG. 22D in the structure for mounting the cable connector according to the fifth embodiment, the opening 76 formed in the connector attachment plate (metal plate) 75 is the elliptical hole and the movable connector 70 is rotatable about the three-axis directions relative to the connector attachment plate (metal plate) 75. That is, in the embodiment illustrated in FIG. 22A to FIG. 22D, the movable connector 70 has a six-axis floating structure in which the movable connector 70 is movable in and rotatable about the vertical and lateral directions (X and Y directions) (four axes) relative to the connector attachment plate (metal plate) 75 and is also movable in and rotatable about the Z direction (two axes) relative to the connector attachment plate (metal plate) 75. Thus, the structure for mounting the movable connector 70 illustrated in FIG. 22A to FIG. 22D in the structure for mounting the cable connector according to the fifth embodiment is effective when the distance of the cable connector 5A mounted on the CPU board 11 from the reference pin P is long.

The disclosed information processing apparatus including the connector for the removable substrate may achieve the following advantages.

(A) A high-density mounting structure in which substrates having a plurality of connectors are fitted to the information processing apparatus at a time may be achieved.

(B) With the structure in which the connector is movable in accordance with one guide pin, a plurality of connectors may properly be fitted by themselves without increasing the dimensional accuracy.

(C) Self-fitting may be achieved irrespective of the accuracy of the parallelism of the guide rails and without arranging the guide pins in a plurality of areas in the substrate and the housing.

(D) The access space for connection work for cables or hoses may be omitted. Therefore, high-density mounting may be achieved for the substrate and the housing and more CPUs may be mounted.

(E) The high-density mounting of the cable connector may achieve downsizing of the substrate. The reduction in the connection distance between the CPUs may achieve high-speed transmission.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An information processing apparatus comprising:
   a substrate that includes a first connector and a second connector;
   a backplane that includes a third connector coupled to the first connector and a fourth connector coupled to the second connector; and
   a metal plate attached to the backplane,
   wherein the metal plate has an opening to which the fourth connector is attached,
   wherein the first connector is arranged near a central part of the substrate on an end side inserted into the backplane and the second connector is arranged on each side of the first connector, and
   wherein a clearance between the opening of the metal plate and the fourth connector increases as a distance from the third connector to the fourth connector increases.

2. The information processing apparatus according to claim 1, wherein the fourth connector is arranged for each of a plurality of the stacked substrates and is fitted to the second connector mounted on the substrate at each stage.

3. The information processing apparatus according to claim 2,
   wherein the backplane is arranged in a housing so as to extend in a stacking direction that is a direction orthogonal to the substrate,
   wherein the substrate and the backplane have guide pins that assist fitting of the first connector and the third connector, and
   wherein the substrate at a certain stage is connected to the substrate at a different stage by being coupled to the backplane through the first connector and the third connector that are fitted together while being guided by the guide pins.

4. The information processing apparatus according to claim 3,
   wherein a pair of the metal plates are arranged on both sides of the backplane so as to extend in the stacking direction of the substrates,
   wherein the pair of the metal plates have a plurality of the openings for respective stages where the substrates are mounted, and
   wherein the fourth connector at a certain stage in one of the metal plates is connected, by a cable, to the fourth connector fitted to the opening formed at the same stage in another one of the metal plates or the fourth connector fitted to the opening formed at another stage in the one of the metal plates.

5. The information processing apparatus according to claim 4,
   wherein the fourth connector fitted to the opening includes
   a pass-through portion inserted through the opening,
   a first engagement portion that is arranged at an end of the pass-through portion and abuts the metal plate when the pass-through portion is inserted into the opening to stop the insertion of the pass-through portion into the opening, and
   a second engagement portion that is arranged on an outer peripheral surface of the pass-through portion, passes through the opening by being deformed when the pass-through portion is inserted into the opening, returns to an original state after passing through the opening, and has a gap between the second engagement portion and the metal plate in a state in which the first engagement portion abuts the metal plate, and
   wherein the fourth connector is slightly movable in three-axis directions by the clearance and the gap in a state in which the fourth connector is fitted to the opening.

6. The information processing apparatus according to claim 5,
   wherein a shape of the opening includes a part of a circle,
   wherein the outer peripheral surface of the pass-through portion is a curved surface, and
   wherein the fourth connector is slightly movable in the three-axis directions and is slightly rotatable about the three-axis directions by the clearance, the gap, the shape of the opening, and a shape of the outer peripheral surface in the state in which the fourth connector is fitted to the opening.

7. The information processing apparatus according to claim 3,
   wherein a box is fixed in the housing such that the substrates are mountable in a stacked state, and
   wherein the backplane and a pair of the metal plates are attached to a rear plate of the box, which is located opposite a side where the substrates are inserted, in a state in which the third connector, the guide pins, and the fourth connector protrude into the box through a hole formed in the rear plate.

8. The information processing apparatus according to claim 4,
   wherein the pair of the metal plates are attachment surfaces of a cable unit that contains the cable in a closed space and is attached to a rear plate, and
   wherein the cable unit has a recess in an area between the pair of the metal plates such that the backplane is housed in the recess.

9. The information processing apparatus according to claim 1,
   wherein a plurality of the third connectors are mounted on the backplane, and
   wherein a maximum separation distance between the plurality of the third connectors is equal to or shorter than a limited distance of a pattern formed on the backplane.

10. The information processing apparatus according to claim 7,
    wherein a plurality of the boxes are mounted in parallel in the housing of the information processing apparatus, and
    wherein the third connector and the fourth connector are arranged on the rear plate of each of the parallel boxes.

11. The information processing apparatus according to claim 7,
    wherein a plurality of the boxes are mounted in parallel in the housing of the information processing apparatus on one surface and an opposite surface of the information processing apparatus with the rear plates of the boxes facing each other, wherein the third connector and the fourth connector are arranged on the rear plate of each of the parallel boxes, and wherein another cable unit connecting the second connectors arranged on the substrates mounted on the boxes that face each other is arranged between each of two sets of the rear plates that face each other.

12. The information processing apparatus according to claim 11, wherein the another cable unit is formed such that an inner housing is retractable relative to an outer housing, wherein the fourth connector is attached, with the clearance, to an opening formed in each of attachment surfaces for the rear plates in the outer housing and the inner housing, and wherein a cable having an extra length connects the fourth connectors attached to the attachment surfaces.

13. The information processing apparatus according to claim 1, wherein each of the first connector and the third connector is a high-density connector connected to a high-speed transmission cable, and wherein each of the second connector and the fourth connector is a cable connector.

* * * * *